(12) United States Patent
Chen et al.

(10) Patent No.: US 10,035,875 B2
(45) Date of Patent: Jul. 31, 2018

(54) PATTERNED FILM STRUCTURE, PATTERNED FILM COMPOSITE STRUCTURE, METHOD OF SELECTIVE INHIBITION OF FORMATION OF ORGANIC FILM AND METHOD OF SELECTIVE ADJUSTMENT OF THICKNESS OF ORGANIC FILM

(71) Applicant: MAY-HWA ENTERPRISE CORPORATION, Taipei (TW)

(72) Inventors: Hsien-Yeh Chen, Taipei (TW); Chih-Yu Wu, Taipei (TW)

(73) Assignee: MAY-HWA ENTERPRISE CORPORATION, Taipei (TW)

( * ) Notice: Subject to any disclaimer, the term of this patent is extended or adjusted under 35 U.S.C. 154(b) by 0 days.

(21) Appl. No.: 15/452,711

(22) Filed: Mar. 7, 2017

(65) Prior Publication Data

US 2017/0349697 A1    Dec. 7, 2017

(30) Foreign Application Priority Data

Jun. 2, 2016 (TW) .............................. 105117310 A

(51) Int. Cl.
```
C08G 61/02      (2006.01)
C09D 165/00     (2006.01)
C23C 16/04      (2006.01)
```

(52) U.S. Cl.
CPC .......... *C08G 61/02* (2013.01); *C09D 165/00* (2013.01); *C23C 16/04* (2013.01); *C08G 2261/11* (2013.01); *C08G 2261/124* (2013.01); *C08G 2261/146* (2013.01); *C08G 2261/149* (2013.01); *C08G 2261/1414* (2013.01); *C08G 2261/312* (2013.01); *C08G 2261/3326* (2013.01)

(58) Field of Classification Search
CPC ........ C08G 61/02; C09D 165/00; C23C 16/04
See application file for complete search history.

(56) References Cited

U.S. PATENT DOCUMENTS

| | | | | |
|---|---|---|---|---|
| 3,415,986 | A | * 12/1968 | Shepard | ................. B29C 59/14 204/165 |
| 2002/0124398 | A1* | 9/2002 | Sturni | ................. C09D 5/4488 29/832 |
| 2007/0226998 | A1* | 10/2007 | Olson | ................. C09D 5/4488 257/670 |

FOREIGN PATENT DOCUMENTS

| | | |
|---|---|---|
| CN | 101255658 A | 9/2008 |
| CN | 103608067 A | 2/2014 |

OTHER PUBLICATIONS

Xing Yu-mei et al., Microfabrication of multichannel flexible neural microelectrodes, Optics and Precision Engineering, vol. 17, No. 10, Oct. 2009, p. 2465-2472, www.eope.net/fileup/PDF/2008-0896.pdf.

\* cited by examiner

*Primary Examiner* — Elizabeth Evans Mulvaney
(74) *Attorney, Agent, or Firm* — Winston Hsu

(57) ABSTRACT

A patterned film structure consists of a substrate and of a patterned polymeric layer which selectively covers and exposes part of the surface of the substrate. The patterned polymeric layer is selected form at least one of an unsubstituted poly-para-xylylene and a substituted poly-para-xylylene.

22 Claims, 19 Drawing Sheets

FORMULA (1)

Reaction (1)

Reaction (2)

Reaction (3)

| Composition | Binding Energy (eV) | Experimental Values (%) | Theoretical Values (%) |
|---|---|---|---|
| C-C/H | 285.0 | 76.2 | 81.0 |
| C-N | 286.2 | 1.8 | 1.6 |
| C=O | 288.6 | 4.4 | 4.8 |
| $\pi \to \pi^*$ | 291.3 | 4.6 | - |
| C-F | 293.0 | 2.0 | 1.6 |
| N | 396.0 | 1.5 | 1.6 |
| O | 532.0 | 4.3 | 4.7 |
| F | 688.0 | 4.6 | 4.7 |

Table 1
FIG. 19

PATTERNED FILM STRUCTURE, PATTERNED FILM COMPOSITE STRUCTURE, METHOD OF SELECTIVE INHIBITION OF FORMATION OF ORGANIC FILM AND METHOD OF SELECTIVE ADJUSTMENT OF THICKNESS OF ORGANIC FILM

CROSS REFERENCE TO RELATED APPLICATION

This application claims priority from Taiwanese Patent Application No. 105117310, filed on Jun. 2, 2016, the contents of which are hereby incorporated by reference in their entirety for all purposes.

BACKGROUND OF THE INVENTION

1. Field of the Invention

The present invention generally relates to a patterned film structure, to a patterned film composite structure, to a method to selectively inhibit the formation of an organic film and to a method to selectively adjust the thickness of an organic film. In particular, the present invention is directed to a method to selectively inhibit the formation of an organic film to obtain a patterned poly-para-xylylene film structure, or directed to obtaining a patterned poly-para-xylylene film composite structure by using a method to selectively adjust a thickness of a target organic film.

2. Description of the Prior Art

Modern trends in biotechnology fields, such as biomaterials, biosensors, biochips, microfluidics, drug delivery, tissue engineering, cellular biology, and regenerative medicine, have targeted controlled designs to mimic and to respond to the biological environments on a molecular scale. The key factor that determines the long term performance as well as high efficiency of biomaterials relies on the surface modification of bio-substrates.

In conventional biomaterial research, the chemical vapor deposition (CVD) is regarded as one of the best synthesizing systems to prepare poly-para-xylylenes. The resultant prepared poly-para-xylylenes have the characteristics of good biocompatibility, good biostability, good moisture-proofing, good chemical resistance, and dielectric property.

However, the current art mainly resides in providing a poly-para-xylylene film to completely cover a substrate or an article. When it comes to a substrate or to an article with an exposed sensor or with an exposed electrode, nevertheless, the complete coverage of the resultant poly-para-xylylene film thereon obviously interferes with the operation of the exposed sensor or the exposed electrode. Nonetheless, currently there is no simple approach available to form a poly-para-xylylene film with any given pattern.

SUMMARY OF THE INVENTION

Given the above, the present invention proposes a patterned film structure, a patterned film composite structure, a method to selectively inhibit the formation of an organic film and a method to selectively adjust the thickness of an organic film. On one hand, the patterned film structure or the patterned film composite structure has a patterned poly-para-xylylene film to expose any given region. On the other hand, the present invention provides a method to selectively inhibit the formation of an organic film or a method to selectively adjust the thickness of an organic film to be able to manipulate the poly-para-xylylene to form a specific pattern, in particular a pattern of extremely small critical dimension, on a substrate or on an article. This is a breakthrough technique to expand the application of an unsubstituted poly-para-xylylene or of a substituted poly-para-xylylene so that the poly-para-xylylene film is capable of combining with various devices or articles to provide a surface-modified bio-substrate system.

In a first aspect, the present invention proposes a patterned film structure. The patterned film structure consists of a substrate and of a patterned polymeric layer. The patterned polymeric layer selectively covers the surface of the substrate. The patterned polymeric layer consists of at least one of an unsubstituted poly-para-xylylene and of a substituted poly-para-xylylene to selectively expose the surface of the substrate.

In one embodiment of the present invention, the substrate is selected from a group consisting of a conductor and of an insulator.

In another embodiment of the present invention, the patterned polymeric layer is a co-polymer. The co-polymer is selected from monomers consists of at least one of an unsubstituted poly-para-xylylene monomer and of a substituted poly-para-xylylene monomer.

In another embodiment of the present invention, the substituted poly-para-xylylene is a poly-para-xylylene substituted with an unsaturated bond, halogen, an aldehyde group, an alkyl group substituted with a hydroxyl group, a halo-alkyl group, a 4-trifluoroacetyl group, an amino-alkyl group, an amide group, an amide group comprising a disulfide bond, a carboxyl group, a biotinyl group, an N-hydroxysuccinimdyl group, an N-maleimide or a carboxyl anhydride.

In another embodiment of the present invention, the patterned polymeric layer has a thickness from 5 nm to 100 μm.

In a second aspect, the present invention proposes a patterned film composite structure. The patterned film composite structure includes a substrate, a conductor layer and a patterned polymeric layer. The conductor layer selectively covers the surface of the substrate. The patterned polymeric layer together with the conductor layer completely covers the surface of the substrate. The patterned polymeric layer consists of at least one of an unsubstituted poly-para-xylylene and of a substituted poly-para-xylylene.

In one embodiment of the present invention, the substrate is a patterned substrate.

In another embodiment of the present invention, the patterned polymeric layer is a co-polymer. The co-polymer is selected from monomers consists of at least one of an unsubstituted poly-para-xylylene monomer and of a substituted poly-para-xylylene monomer.

In another embodiment of the present invention, the substituted poly-para-xylylene is a poly-para-xylylene substituted with an unsaturated bond, a halogen, an aldehyde group, an alkyl group substituted with a hydroxyl group, a halo-alkyl group, a 4-trifluoroacetyl group, an amino-alkyl group, an amide group, an amide group comprising a disulfide bond, a carboxyl group, a biotinyl group, an N-hydroxysuccinimdyl group, an N-maleimide or a carboxyl anhydride.

In another embodiment of the present invention, the patterned polymeric layer may cover the conductor layer or not.

In another embodiment of the present invention, the patterned polymeric layer has a variable thickness from 5 nm to 100 μm.

In a third aspect, the present invention provides a method to selectively inhibit the formation of an organic film. First, a substrate or an article is provided. Second, a precursor, such as a monomer with a para-xylylene moiety is provided under a pre-determined condition so that the precursor forms an organic film on the substrate or on the article. The organic film consists of at least one of an unsubstituted poly-para-xylylene and of a substituted poly-para-xylylene. The pre-determined condition favors the selective inhibition of the formation of the organic film so that the organic film forms a given pattern which selectively covers the surface of the substrate or the article and the organic film selectively exposes the surface of the substrate or the article.

In one embodiment of the present invention, the substrate is selected from a group consisting of a conductor and of an insulator. The organic film does not cover the conductor.

In another embodiment of the present invention, the pre-determined condition is selected from a group consisting of adjusting voltage, adjusting a charge density, adjusting a deposition rate, adjusting the ingredient of the precursor, adjusting the formation time of selectively inhibiting, adjusting the formation temperature of selectively inhibiting and adjusting the composition of the substrate.

In another embodiment of the present invention, the organic film is a co-polymer. The co-polymer consists of at least one of an unsubstituted poly-para-xylylene monomer and of a substituted poly-para-xylylene monomer.

In another embodiment of the present invention, the substituted poly-para-xylylene is a poly-para-xylylene substituted with an unsaturated bond, a halogen, an aldehyde group, an alkyl group substituted with a hydroxyl group, a halo-alkyl group, a 4-trifluoroacetyl group, an amino-alkyl group, an amide group, an amide group comprising a disulfide bond, a carboxyl group, a biotinyl group, an N-hydroxysuccinimdyl group, an N-maleimide or a carboxyl anhydride.

In another embodiment of the present invention, the organic film has a thickness from 5 nm to 100 μm.

In a fourth aspect, the present invention proposes a method to selectively adjust the thickness of an organic film. First, a substrate or an article is provided. The substrate or the article includes a patterned conductor layer which is exposed. Second, a precursor is provided under a pre-determined condition so that the precursor forms an organic film. The organic film completely covers the substrate or the article. The organic film is selected from a group consisting of an unsubstituted poly-para-xylylene and of a substituted poly-para-xylylene. The organic film forms a given pattern of a thickness which is variable on the substrate or the article.

In one embodiment of the present invention, the substrate is selected from a group consisting of the patterned conductor layer and an insulator. The thickness on the insulator is greater than that on the patterned conductor layer.

In another embodiment of the present invention, the pre-determined condition is selected from a group consisting of adjusting voltage, adjusting a charge density, adjusting a deposition rate, adjusting the ingredient of the precursor, adjusting the formation time of selectively inhibiting, adjusting the formation temperature of selectively inhibiting and adjusting the composition of the substrate.

In another embodiment of the present invention, the substituted poly-para-xylylene is a poly-para-xylylene substituted with an unsaturated bond, a halogen, an aldehyde group, an alkyl group substituted with a hydroxyl group, a halo-alkyl group, a 4-trifluoroacetyl group, an amino-alkyl group, an amide group, an amide group comprising a disulfide bond, a carboxyl group, a biotinyl group, an N-hydroxysuccinimdyl group, an N-maleimide or a carboxyl anhydride.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 illustrates a conductor has a pattern to be embedded in the insulator.

FIG. 2 illustrates the substrate is placed in a reaction chamber to undergo a predetermined polymeric deposition reaction under a suitable condition with a suitable precursor.

FIG. 3 illustrates a method to selectively inhibit the formation of an organic film of the present invention.

FIG. 4 illustrates a method to selectively adjust the thickness of an organic film of the present invention.

FIG. 19 shows Table 1 of X-ray photoelectron spectroscopy analysis of the obtained co-polymer organic film.

DETAILED DESCRIPTION

Examples and embodiments are given to further describe various modes of the present invention. In the specification, the term "step" is not only for an independent step. It does not exclude the condition where the expected effect of the step is satisfied.

In the disclosure, the chemical structure of a compound is sometimes represented by a skeleton formula, in which carbon atoms, hydrogen atoms and carbon-hydrogen bonds may be optionally omitted. However, it should be based on the plotted version when a functional group is clearly depicted in a structure.

In the disclosure, ranges defined by "a numerical value to another numerical value" are shorthand representations used to avoid listing all of the numerical values in the specification. Therefore, the recitation of a specific numerical range is equivalent to the recitation of any and all numerical values in that numerical range and discloses a smaller numerical range defined by any two numerical values in that numerical range, as is the case with the numerical value and the smaller numerical range being disclosed in the specification.

The present invention in a first aspect provides a method to manipulate the formation of an organic film. Such method is not only able to manipulate if an organic film is formed in a given region or not but also able to manipulate the formation rate of an organic film in a given region, to finally form an organic cap film of an optional thickness and to selectively adjust the thickness of an organic film. Please refer to FIG. 1, FIG. 3 to FIG. 4 and FIG. 12; they illustrate a method to manipulate the formation of an organic film of the present invention. First, please refer to FIG. 1, FIG. 1A and FIG. 1B, a substrate 110, or an article, such as a bio-catheter, a stent, or a pacemaker is provided. The substrate 110 refers to an object with a large flat surface, such as a test stripe, and the article refers to an object of a specific 3D shape, such as a probe. The present invention applies to both the object with a large flat surface and the object of a specific 3D shape.

Figure 1:
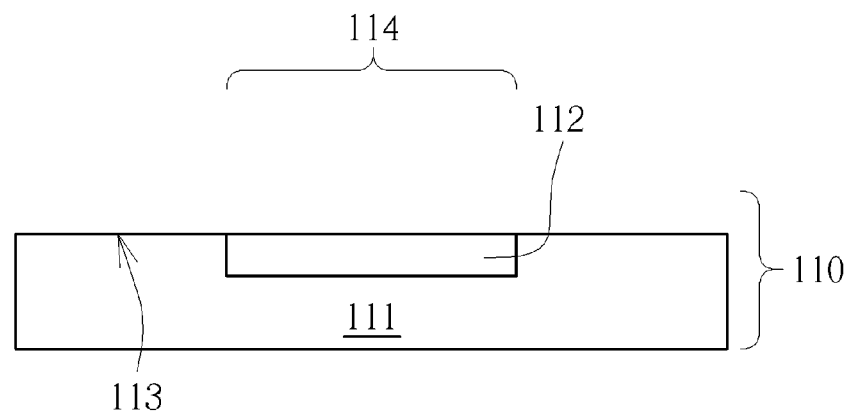
FIG. 1 to FIG. 4 illustrate a method to manipulate the formation of an organic film of the present invention.
Figure 1A:
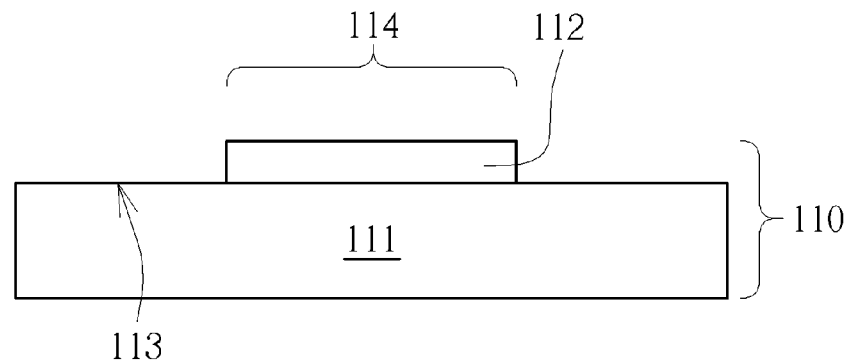
FIG. 1A illustrates a conductor has a pattern to cover the outer surface of an insulator.
Figure 1B:
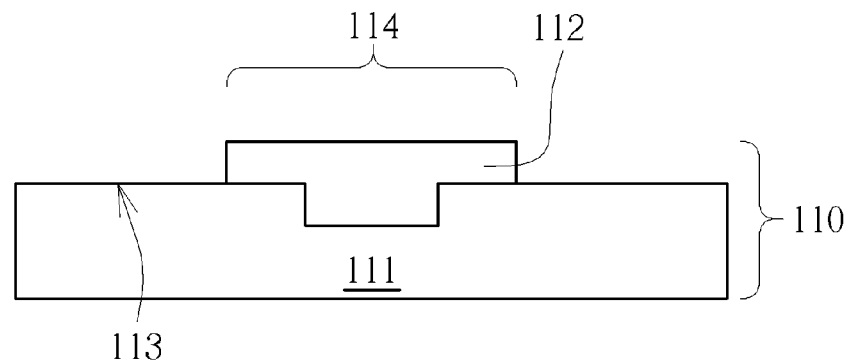
FIG. 1B illustrates a conductor has a pattern embedded in and covering the insulator.

For example, the substrate 110 or the article may be a combination of an insulator 111 and a conductor 112. The insulator 111 may be at least one of an insulating material such as plastic, polymer, rubber, resin, glass and ceramic . . . etc. The conductor 111 may be at least one of a conductive material such as a metal, an alloy, a transparent conductive material, conductive rubber, conductive polymer and graphite . . . etc. To be more specific, the polymer may be polymethylmethacrylate or polystyrene. The metal may be titanium, gold or silver. If the substrate 110 or the article is a combination of an insulator 111 and a conductor 112, the conductor 112 may have a pattern 114 to be embedded in the insulator 111, as shown in FIG. 1. Or, the conductor 112 may have a pattern 114 to cover the outer surface 113 of the insulator 111, as shown in FIG. 1A. Or alternatively, the conductor 112 may have a pattern 114 embedded in and covering the insulator 111, as shown in FIG. 1B. No matter how the arrangements are in FIG. 1, FIG. 1A or in FIG. 1B, the insulator 111 always makes the conductor 112 exposed. Because of the combination of the insulator 111 and the conductor 112, the insulator 111 and the conductor 112 each has its own pattern. The following description is an example of the substrate 110 with the conductor 112 of the pattern 114.

Figure 2:
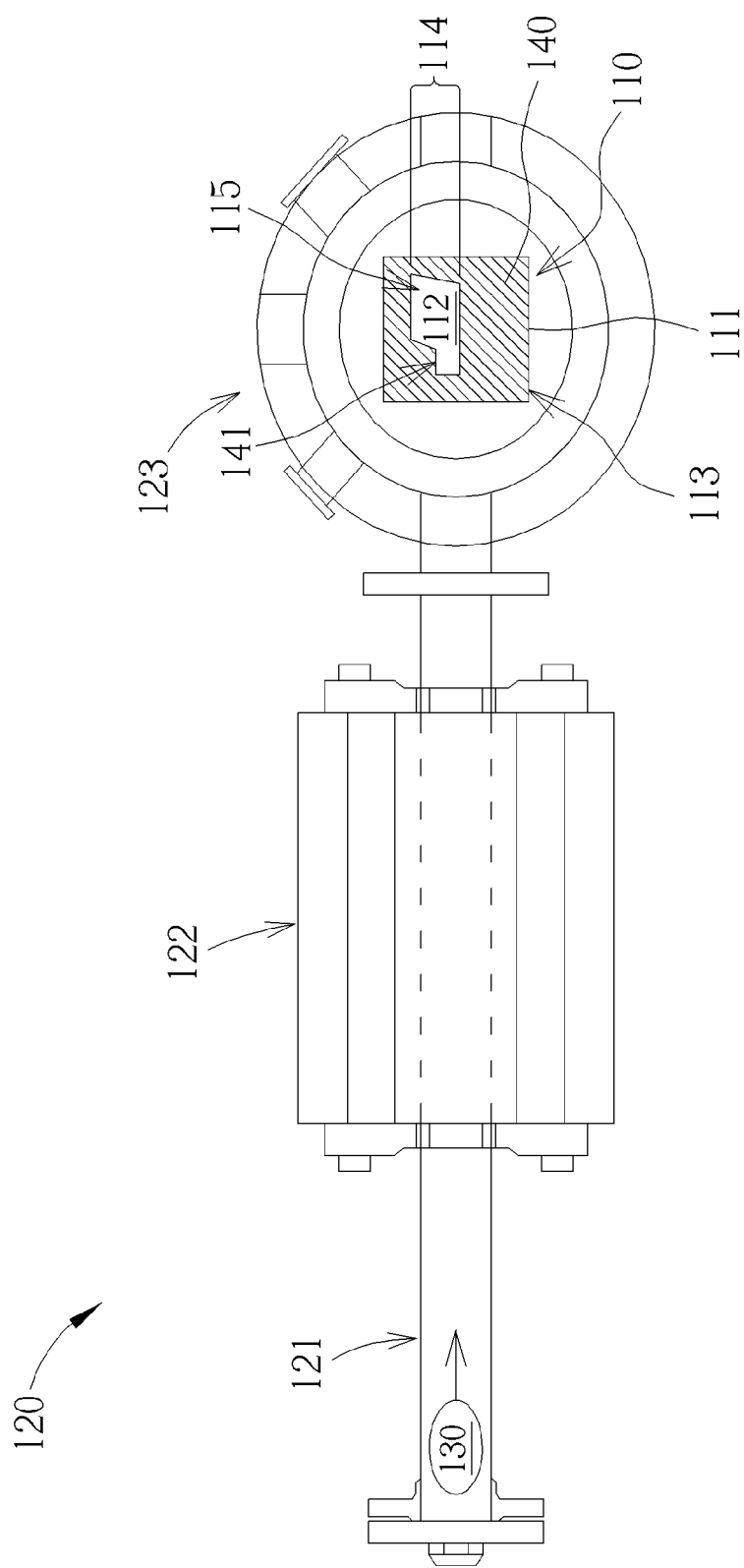

Second, as shown in FIG. 2, the substrate 110 is placed in a reaction chamber 120 to undergo a predetermined polymeric deposition reaction under a suitable condition with a suitable precursor 130. The polymeric deposition reaction of the present invention is a polymeric deposition reaction of the exclusive combination of an unsubstituted poly-para-xylylene moiety and a substituted poly-para-xylylene moiety so that the precursor 130 of the poly-para-xylylene moiety forms an organic film 140 of poly-para-xylylene on the substrate 110. Accordingly, the suitable predetermined condition favors the regional inhibition of the polymeric deposition reaction of poly-para-xylylene so that the organic film 140 forms a given pattern which selectively covers the substrate 110 and simultaneously selectively exposes the surface of the substrate 110, that is, the surface 115 of the conductor 112. Because the organic film 140 selectively covers the substrate 110, the process of the precursor 130 of the para-xylylene which forms a patterned poly-para-xylylene organic film 140 on the substrate 110 may be regarded as the precursor 130 self-aligns with the pattern 114 of the substrate 110 when the precursor 130 undergoes the predetermined polymeric deposition reaction, which is one of the features of the present invention.

Figure 2A:
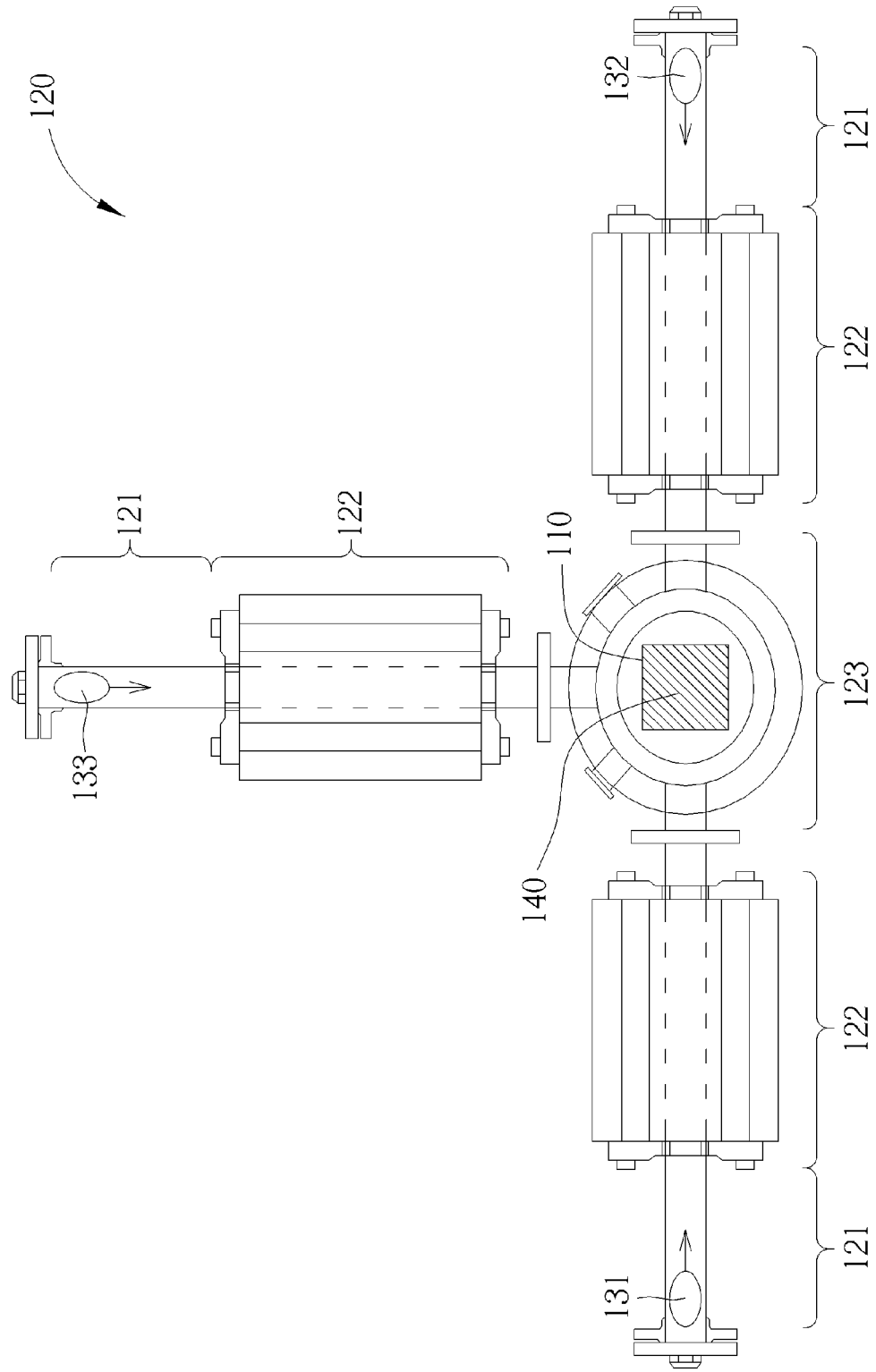
FIG. 2A illustrates a polymeric deposition device to perform the predetermined polymeric deposition reaction.

Or alternatively, a polymeric deposition device illustrated in FIG. 2A may be used to perform the predetermined polymeric deposition reaction. For example, the precursor 131, the precursor 132 and the precursor 133 each is fed into the reaction chamber 121 from a different direction. The device is characterized in that parameters may be adjusted in according with different starting materials. The parameters may be one of voltage, a charge density, a deposition rate and formation time for adjusting selectively inhibition.

The predetermined condition suitable for the polymeric deposition reaction may be sublimation and followed by pyrolysis of suitable precursor 130, precursor 131, precursor 132 and precursor 133 to generate radicals, and the radicals generated in the pyrolysis step gradually undergo polymeric deposition reaction on the substrate 110 to form the organic film 140 of poly-para-xylylene with a pattern 141. For example, the reaction chamber 120 has a sublimation zone 121, a pyrolysis zone 122, and a deposition chamber 123. The precursor 130, 131, 132 and 133 of unsubstituted poly-para-xylylene moiety or of substituted poly-para-xylylene moiety are inhaled from the sublimation zone 121, undergo a pyrolysis process in the pyrolysis zone 122 to generate radicals, and the generated radicals then gradually deposit on the substrate 110 placed in the deposition chamber 123 so a structure covered with a patterned film 140 or a composite structure covered with a patterned film 140 is resultantly obtained.

The temperature for the sublimation step may be from 100° C. to 200° C., preferably from 120° C. to 150° C. The pressure may be from 30 mtorr to 150 mtorr, preferably from 30 mtorr to 100 mtorr. The temperature for the pyrolysis zone may be from 500° C. to 800° C., preferably from 600° C. to 700° C. The pressure for the chemical vapor deposition may be from 30 mtorr to 150 mtorr. The substrate temperature for the chemical vapor deposition may be from −40° C. to 30° C., preferably from 10° C. to 25° C., more preferably from 15° C. to 20° C. The deposition rate of the chemical vapor deposition may be from 0.3 Å/s to 20 Å/s. The chemical vapor deposition may be a neat reaction to be free of a catalyst and free of a solvent.

The substituents of the substituted para-xylylene precursor 130 may be various substituents to imbue the organic film 140 of poly-para-xylylene with various desirable physicochemical properties. The substituents may be but not limited to, at least one of an unsaturated bond, halogen, an aldehyde group, an alkyl group substituted with a hydroxyl group, a halo-alkyl group, a 4-trifluoroacetyl group, an amino-alkyl group, an amide group, an amide group comprising a disulfide bond, a carboxyl group, a biotinyl group, an N-hydroxysuccinimdyl group, an N-maleimide and a carboxyl anhydride.

The substituted para-xylylene precursor may be a compound represented by the formula (1). For example, each substituent $R_1$, $R_2$, $R_3$, $R_4$, $R_5$, $R_6$, $R_7$, and $R_8$ may be independently selected from an ethylenic double bond, a triple bound, a functional group comprising an amino (—$NH_2$) group, a functional group comprising a hydroxyl (—OH) group, a functional group comprising an carboxyl (—COOH) group, —C(=O)H, —C(=O)—$CFH_2$, —C(=O)—$CF_3$, —C(=O)—$C_2F_5$, —C(=O)—$C_8F_{17}$, —C(=O)—OH, —C(=O)—Ph, —C≡CH, —CH=$CH_2$, —$CH_2$—OH, —$CH_2$—$NH_2$, —$NH_2$, —C(=O)—O—$CH_3$, —C(=O)—O—$C_2H_5$, —$CH_2$—O—C(=O)—C—$(CH_3)_2$Br, —$CH_2$—O—C(=O)—C≡CH . . . etc. so the organic film 140 may also be a co-polymer consisting of at least one of an unsubstituted poly-para-xylylene monomer and different substituted poly-para-xylylene monomers.

In another embodiment of the present invention, the pre-determined condition further includes a condition for inhibiting the formation of the organic film 140 or for inhibiting the growth of the organic film 140 to selectively adjust the thickness of the organic film 140. A condition for inhibiting the formation of the organic film 140 refers to a condition which makes the organic film 140 completely unable to form. A condition for inhibiting the growth of the organic film 140 refers to a condition which merely makes the organic film 140 grow slower. Please refer to FIG. 3, inhibiting the formation of the organic film 140 makes the organic film 140 unable to completely cover the surface 115 of the substrate 110. In other words, the organic film 140 fails to cover the conductor 112 so the organic film 140 with a given pattern 141 is formed at the same time. Such given pattern 141 exposes the native surface of the substrate 110.

Figure 4:
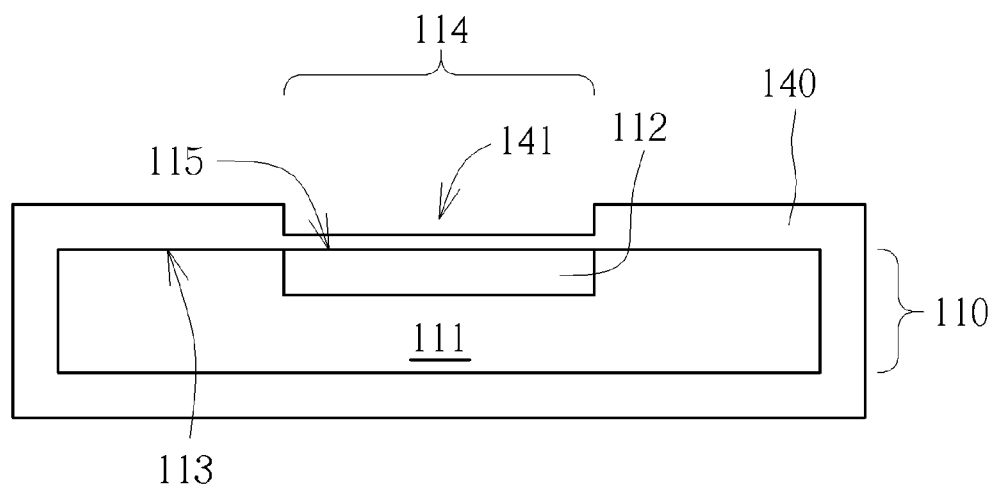

Please refer to FIG. 4, although inhibiting the growth of the organic film 140 still allows the organic film 140 to grow on the surface 113 of the insulator 111 and on the surface 115 of the conductor 112, to obtain a substrate 110 completely wrapped inside the organic film 140 but the thickness of the organic film 140 in different regions is definitely distinctive to result in a given pattern 141, namely a given pattern 141 of variable thickness. In other words, the thickness of the organic film 140 on a product is not only variable but also can be manipulated to an extent which is needed. It is another feature of the present invention. The thickness of the organic film 140 may be from 5 nm to 100 μm.

To adjust the thickness of the organic film 140 may adjust one parameter or some parameters in combination. The candidate parameters may be adjusting voltage, adjusting a charge density, adjusting a deposition rate, adjusting the ingredient of the precursor, adjusting the formation time of selectively inhibiting, adjusting the formation temperature of selectively inhibiting and adjusting the composition of the substrate. When the organic film 140 grows on the insulator 111 and on the conductor 112 to obtain a given pattern 141 of variable thickness, the thickness of the organic film 140 on the insulator 111 is usually greater than the thickness on the conductor 112. This is due to the maximum selective deposition thickness. No matter the pattern 141 of the organic film 140 covers the substrate 110 or not, the pattern 141 of the organic film 140 always self-aligns to the pattern 114 of the substrate 110. It is still another feature of the present invention.

For example, when the polymeric deposition reaction is carried out and there are the insulator 111 and the conductor 112 disposed on the surface of the substrate 110, the conductor 112 may be supplied with sufficient electric voltage and/or its charge density may be adjusted to inhibit the growth of the organic film 140 or to inhibit the formation of the organic film 140 so that the thickness of the organic film 140 on a product may be selectively adjusted. No matter a substrate 110 or an article is involved in this polymeric deposition reaction, it may consist of at least one of an insulator 111 and a conductor 112 but excludes a semiconductor. A semiconductor refers to a material which is unable to generate sufficient electric voltage and/or unable to generate sufficient charge density and fails to selectively inhibit the formation of the organic film 140 or fails to selectively adjust the thickness of the organic film 140 so a semiconductor is not taken into consideration.

When different insulators 111 go with various conductors 112 to make up a substrate 110, inhibition of the growth of the organic film 140 or inhibition the formation of the organic film 140 can be respectively observed as the conductor 112 is supplied with different electric voltage and/or charge density. The applied electric voltage may be from 10 kV to 50 kV, preferably from 20 kV to 40 kV, more preferably from 30 kV to 35 kV. The applied charge density may be from 0.01 $C/cm^2$ (Coulomb/$cm^2$) to 0.1 $C/cm^2$, preferably from 0.03 $C/cm^2$ to 0.06 $C/cm^2$, more preferably from 0.045 $C/cm^2$ to 0.05 $C/cm^2$.

Figure 5:
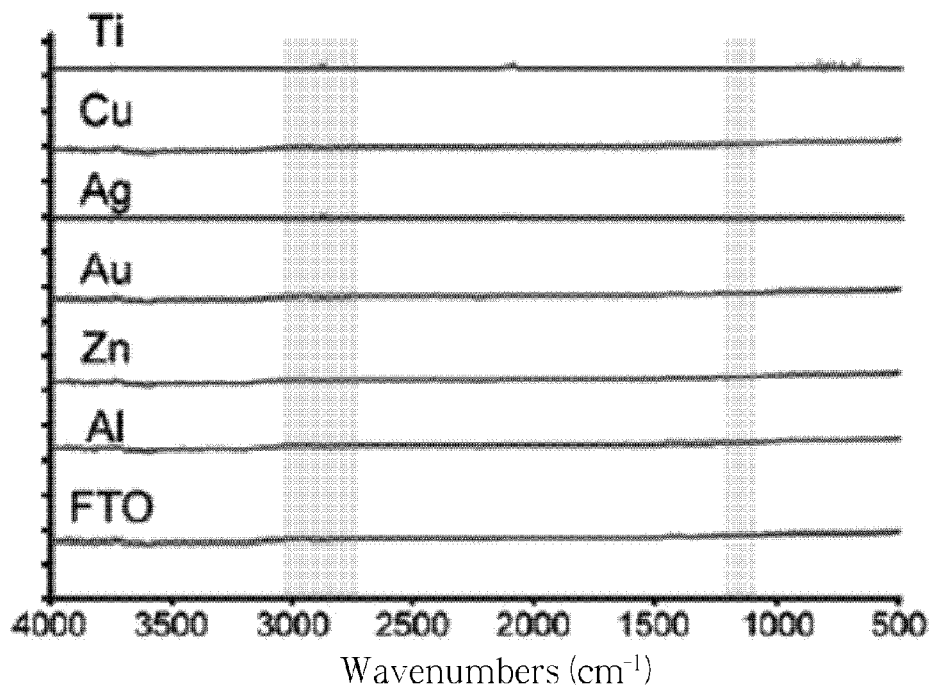
FIG. 5 and FIG. 5A respectively illustrate the Fourier transform infrared reflection absorption spectroscopy (IR-RAS) spectra of PPX-C and PPX-aldehyde of the present invention which is unable to form an organic film on the surfaces of various metals at a charge density.
Figure 5A:
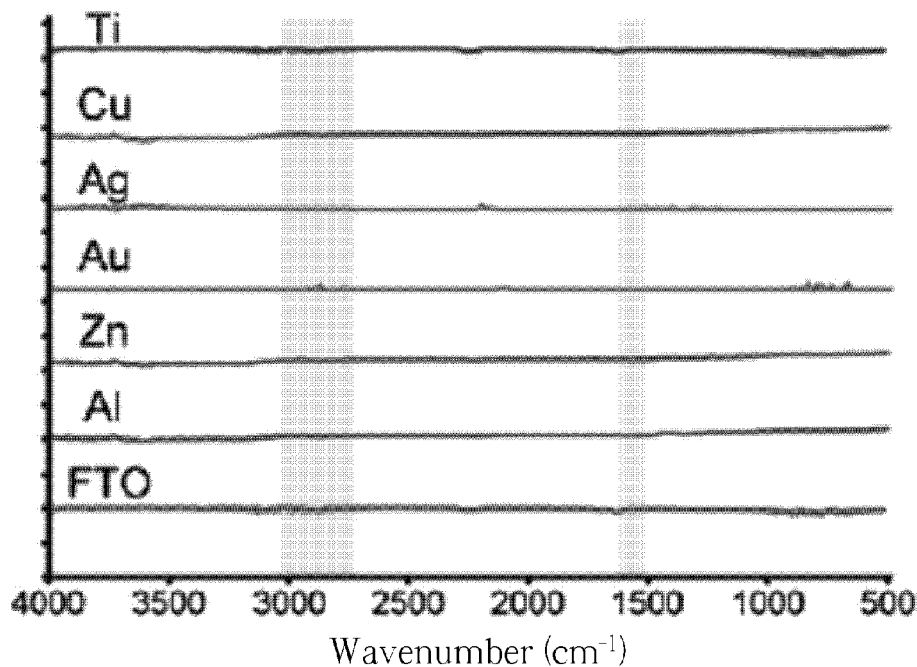

FIG. 5 and FIG. 5A respectively illustrate the Fourier transform infrared reflection absorption spectroscopy (IR-RAS) spectra of PPX-C (poly-dichloro-para-xylylene or commercially named parylene C) and PPX-aldehyde (aldehyde-functionalized poly-para-xylylene) of the present invention. The precursor of PPX-C and the precursor of PPX-aldehyde all completely fail to form an organic film on the surfaces of various metals at a charge density of 0.05 $C/cm^2$. FTO refers to fluorine-doped $SnO_2$(sic passim). The maximum value of each line in the spectra is regarded as 100% absorption of each corresponding material involved (sic passim). FIG. 5 and FIG. 5A clearly suggest that the polymeric deposition reaction for para-xylylene precursors with various substituents is inhibited as long as a charge density is applied.

Figure 6:
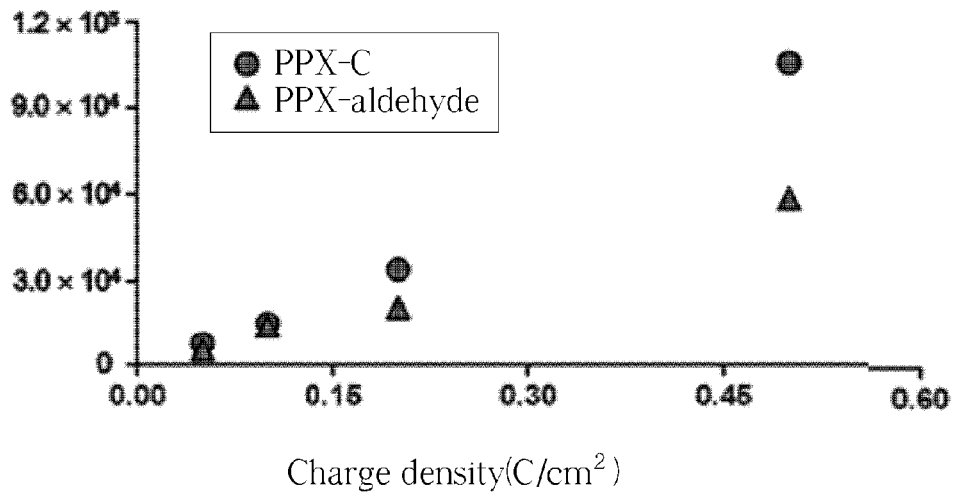
FIG. 6 illustrates a correlation of the maximum selective deposition thickness at different charge density of the PPX-C organic film and the PPX-aldehyde organic film of the present invention.

FIG. 6 illustrates a correlation of the maximum selective deposition thickness at different charge densities of the PPX-C organic film and the PPX-aldehyde organic film of the present invention. The existence of an upper limit, i.e., a maximum deposition thickness of the poly-para-xylylene, at which deposition will commence and the relative selectivity of the charged surface will be lost, was examined on an Al substrate, which previously showed no inhibitory effect for poly-para-xylylenes. FIG. 6 clearly suggests that different charge densities results in different maximum deposition thickness for the same polymeric material, but different polymeric materials result in different maximum deposition thickness at the same charge density. As a result, the present invention also provides an approach to adjust the needed thickness of a poly-para-xylylene organic film by providing different charge densities. Generally speaking, the charge density increases in proportion to higher maximum deposition thickness.

Figure 7:
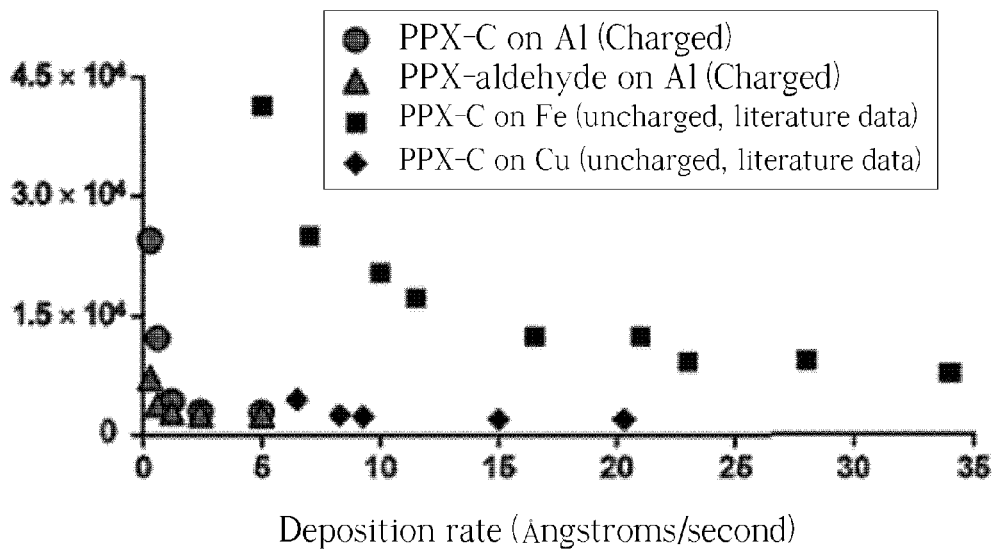
FIG. 7 illustrates a correlation between the deposition rate of the PPX-C organic film as well as the PPX-aldehyde organic film and the maximum selective deposition thickness under the influence of an electric field of the present invention.

FIG. 7 illustrates a correlation between the deposition rate of the PPX-C organic film as well as the PPX-aldehyde organic film and the maximum selective deposition thickness under the influence of an electric field of the present invention. FIG. 7 clearly suggests that a sufficiently high charge density is capable of completely inhibiting the simultaneous deposition of para-xylylene precursors with various substituents. Transitional metals, such as Fe, Cu, Ag and Pt with high surface energy develop superficially inhibiting influences on the growth of the organic film or on the formation of the organic film.

In addition to providing different electric voltages and/or charge density to respectively result in the inhibition of the growth of the organic film or in the inhibition the formation of the organic film, adjusting the deposition rate, adjusting the ingredient(s) of the precursor(s), adjusting the formation time of selectively inhibiting, adjusting the formation temperature of selectively inhibiting and adjusting the composition of the substrate may also possibly result in the influence on the inhibition of the growth of the organic film or on the inhibition the formation of the organic film. For example, FIG. 6 also suggests that precursors with various substituents indeed influence the maximum deposition thickness of resultant poly-para-xylylene so the thickness of the organic film 140 may be adjusted by adjusting the ingredient(s) of the precursor(s).

Further, except providing the substrate with voltage of charge density, the thickness of the organic film 140 may also be adjusted by adjusting the deposition rate or adjusting the formation time during selectively inhibiting. For example, to obtain an organic film of smaller thickness, the deposition rate may be lower or the formation time during selectively inhibiting is reduced. In other words, to obtain an organic film of larger thickness, the deposition rate may be higher or the formation time during selectively inhibiting is increased.

Figure 8:
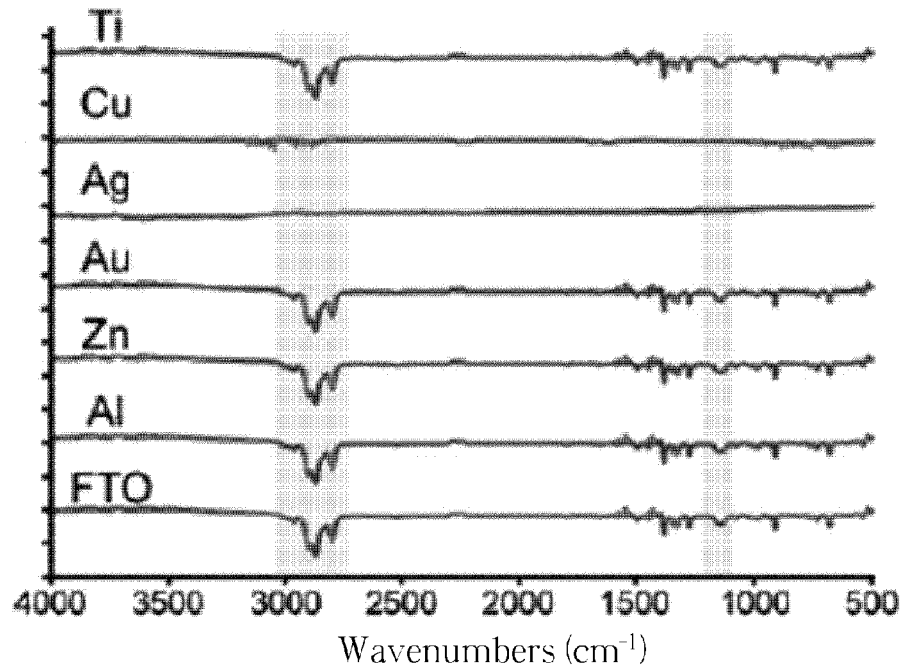
FIG. 8 illustrates the deposition results of the PPX-C organic film of the present invention on different metal surfaces.
Figure 8A:
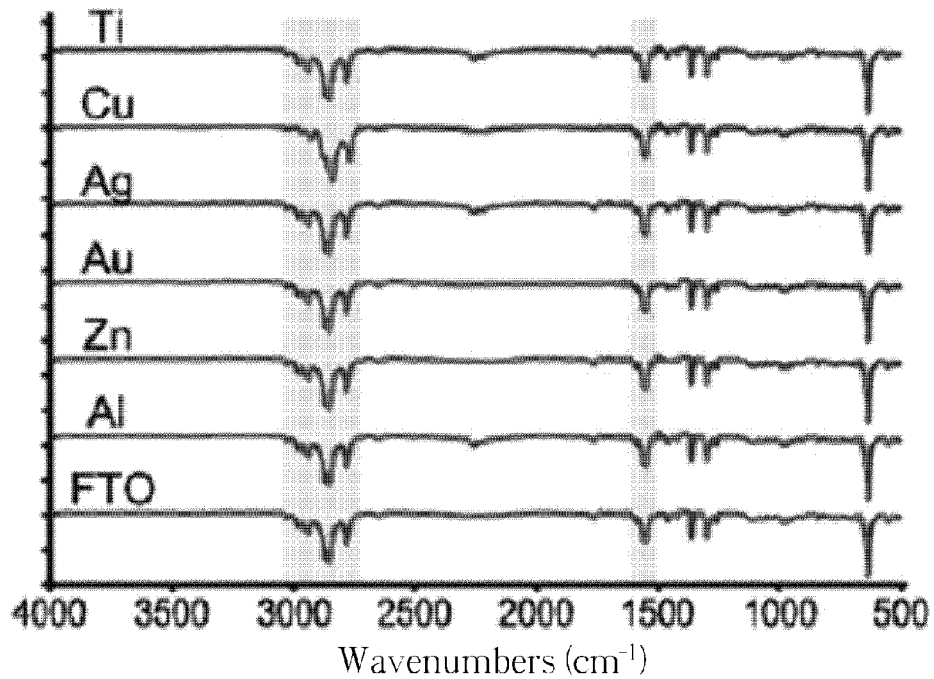
FIG. 8A illustrates the deposition results of the PPX-aldehyde organic film of the present invention on different metal surfaces.

The thickness of the organic film may also be adjusted by adjusting the formation temperature during selectively inhibiting. The change of the temperature influences the deposition efficiency of the film, for example higher the temperature lower the deposition rate is, and vice versa. Moreover, the inventor also notices that the compositions of the substrate may also influence the formation of the organic film. For example, FIG. 8 illustrates the deposition results of the PPX-C organic film of the present invention on different metal surfaces. FIG. 8A illustrates the deposition results of the PPX-aldehyde organic film of the present invention on different metal surfaces. FIG. 8 and FIG. 8A clearly suggest that Cu and Ag respectively are able to completely inhibit the deposition of PPX-C film in the absence of the substrate's charge density but Cu or Ag fails to influence the deposition of PPX-aldehyde film to yield selective deposition. The uninhibited deposition thickness of the organic films in each figure is 150 nm.

Figure 9:
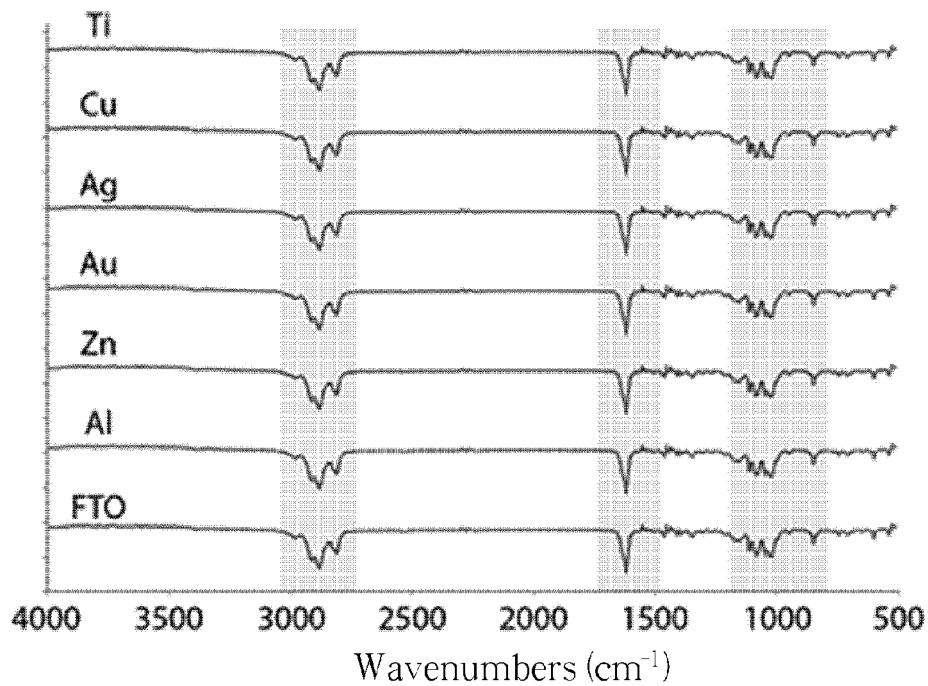
FIG. 9 illustrates the deposition results of an organic film of PPX-TFA of the present invention on different conductor surfaces in the absence of the influence of charge density.
Figure 9A:
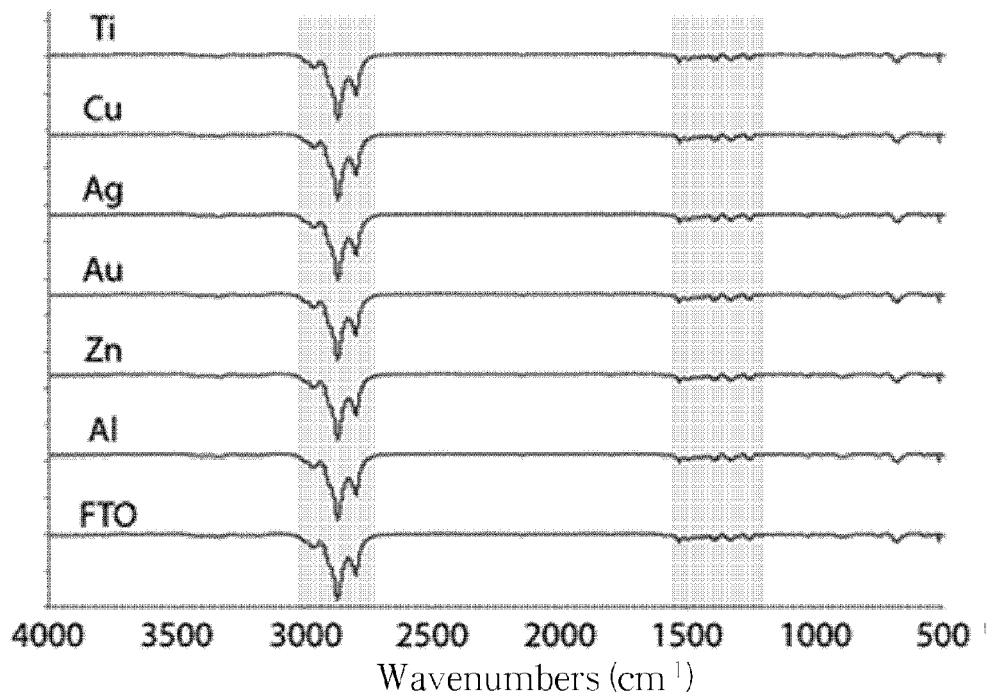
FIG. 9A illustrates different deposition results of an organic film of PPX-TFA of the present invention on different conductor surfaces in the presence of the influence of charge density.
Figure 10:
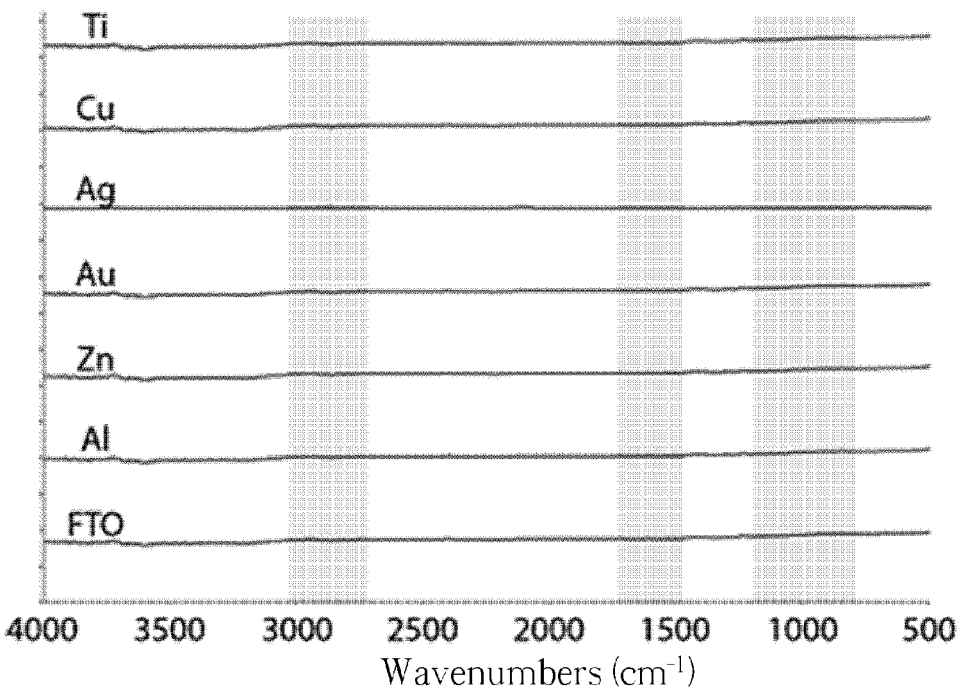
FIG. 10 illustrates the deposition results of an organic film of PPX-amine of the present invention on different conductor surfaces in the absence of the influence of charge density.
Figure 10A:
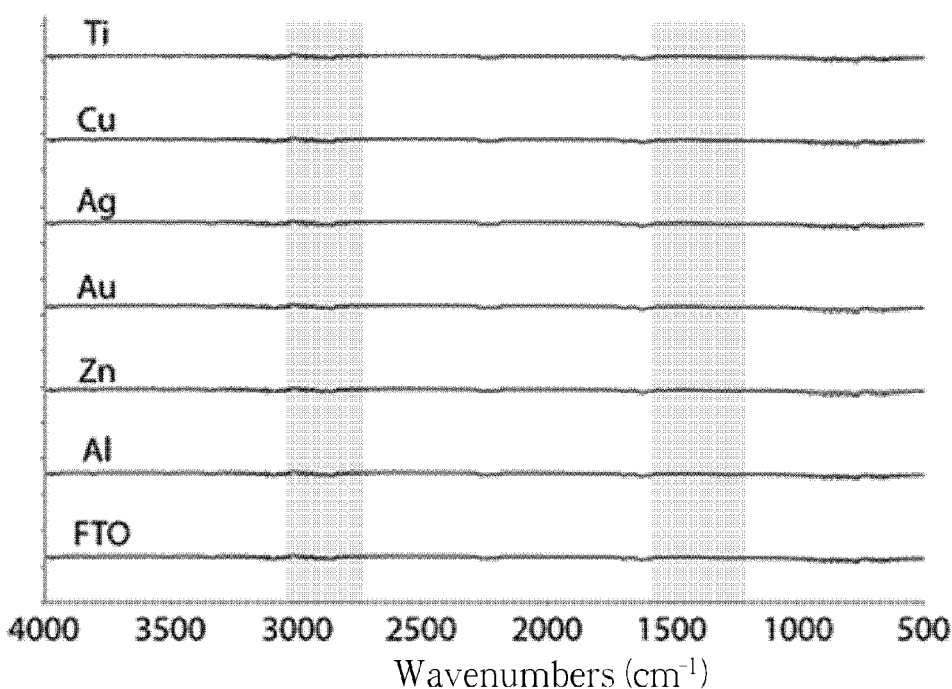
FIG. 10A illustrates the different deposition results of an organic film of PPX-amine of the present invention on different conductor surfaces in the presence of the influence of charge density.

FIG. 9 illustrates the deposition results of an organic film of trifluoroacetic-functionalized poly-para-xylylene (PPX-TFA) of the present invention on different conductor's surfaces in the absence of the influence of charge density. FIG. 9A illustrates different deposition results of an organic film of PPX-TFA of the present invention on different conductor's surfaces in the presence of the influence of charge density. FIG. 10 illustrates the deposition results of an organic film of aminomethyl-functionalized poly-para-xylylene (PPX-amine) of the present invention on different conductor's surfaces in the absence of the influence of charge density. FIG. 10A illustrates the different deposition results of an organic film of PPX-amine of the present invention on different conductor's surfaces in the presence of the influence of charge density.

FIG. 9, FIG. 9A, FIG. 10 and FIG. 10A clearly suggest that the charge density has positive effects on completely inhibiting the polymeric deposition of an organic film of PPX-TFA or of PPX-amine although Cu or Ag does not show any influence on the polymeric deposition of an organic film of PPX-TFA or of PPX-amine. The uninhibited deposition rate of the organic films in FIG. 9 and FIG. 10 is 300 nm/s with the deposition thickness of around 150 nm.

Figure 11:
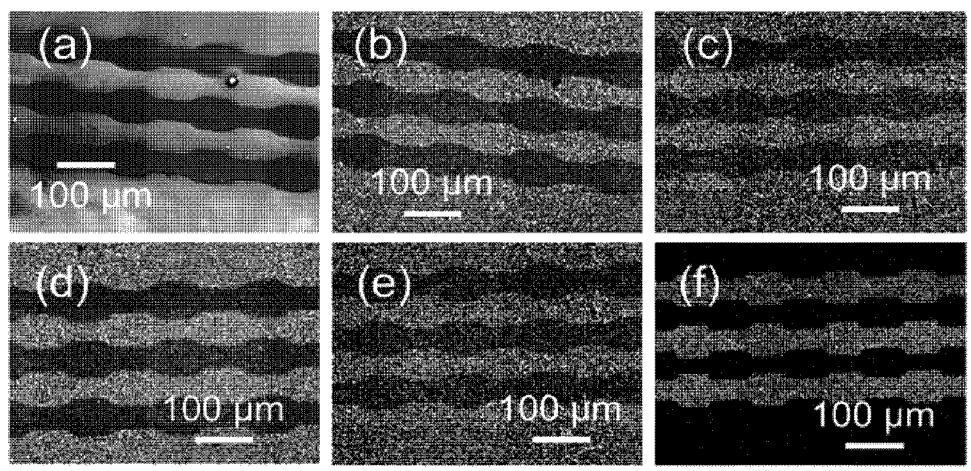
FIG. 11 illustrates patterned poly-para-xylylene organic films which correspond to PPX-TFA, PPX-amine, PPX-aldehyde and PPX-C on a substrate with patterned Al layer.

FIG. 11 illustrates the patterned poly-para-xylylene organic films which correspond to PPX-TFA, PPX-amine, PPX-aldehyde and PPX-C on a substrate with patterned Al layer. These figures illustrate the elemental mapping analysis results of energy dispersive X-ray spectroscopy (EDS) technique to go with the images from scanning electron microscopy (SEM). For example, a poly-para-xylylene organic film of PPX-TFA on a material surface provides a direct evidence of spatially confined distribution of fluorine signals (figure b), a poly-para-xylylene organic film of PPX-amine on a material surface provides a direct evidence of spatially confined distribution of nitrogen signals (figure c), a poly-para-xylylene organic film of PPX-aldehyde on a material surface provides a direct evidence of spatially confined distribution of oxygen signals (figure d), and a poly-para-xylylene organic film of PPX-C on a material surface provides a direct evidence of spatially confined distribution of chlorine signals (figure e). Accordingly, persons of ordinary skills in the art may have the discretions to provide suitable parameters to obtain desirable results which meet expectations when practicing the present invention so the details will not be elaborated here.

Figure 12:
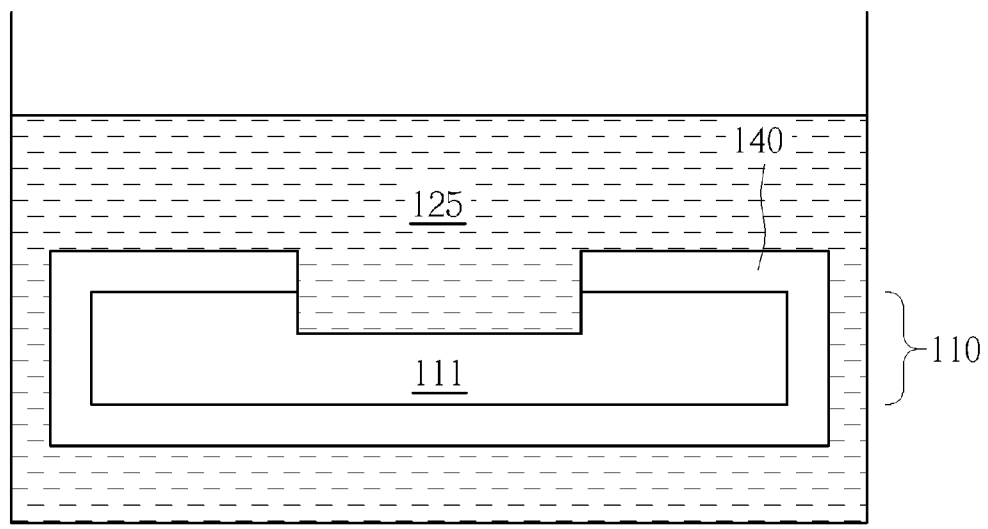
FIG. 12 illustrates a method to strip the conductor layer which is not covered by the organic film of the present invention after the organic film is formed.

The above steps to manipulate the formation of an organic film of the present invention may be followed by an optional stripping step carried out to completely remove the exposed conductor which is not covered by the organic film. If the conductor 112 is a metal, an immersing solution containing an oxidizing agent, an acidic solution or a basic solution, maybe used to strip the metal, as shown in FIG. 12. If the conductor 112 is a transparent conductive material, a conventional oxidizing agent or an acidic solution may go with a suitable surfactant to carry out a wet etching stripping procedure.

Figure 13:
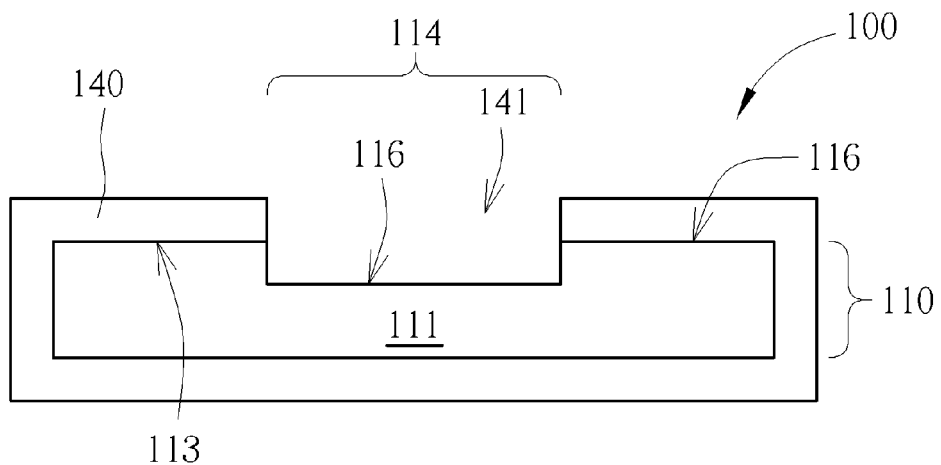
FIG. 13 illustrates a patterned film structure without a conductor after the stripping step.
Figure 14:
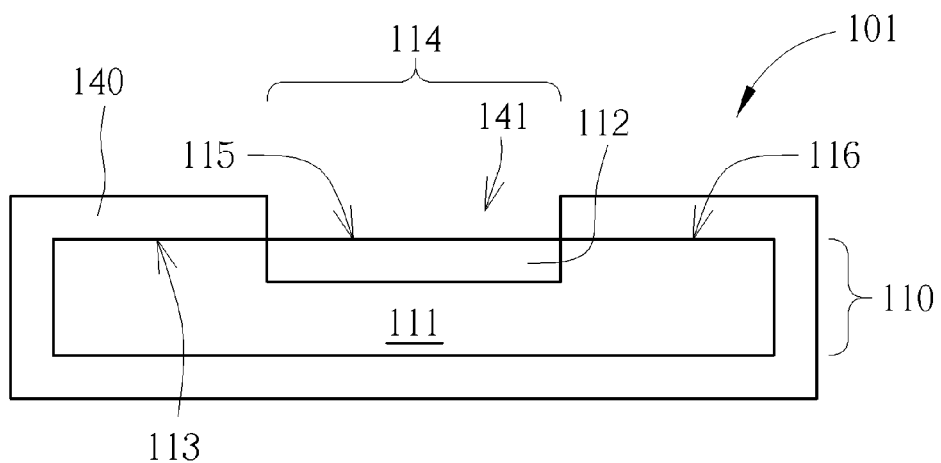
FIG. 14 illustrates a patterned film composite structure with the organic film not covering the conductor.
Figure 15:
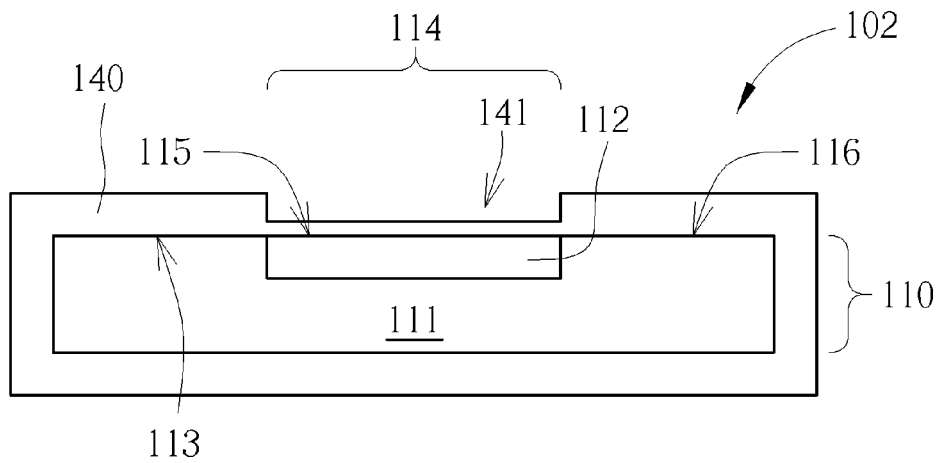
FIG. 15 illustrates a patterned film structure with a conductor sandwiched between the insulator and the organic film.

After the above steps of the present invention, an optional patterned film structure or an optional patterned film composite structure is obtained. FIG. 13 illustrates a patterned film structure 100 without a conductor 112 after the above stripping procedure. FIG. 14 illustrates a patterned film composite structure 101 with the organic film 140 not covering the conductor 112. FIG. 15 illustrates a patterned film structure 102 with a conductor 112 sandwiched between the insulator 111 and the organic film 140 so in the patterned film structure 100, the patterned film composite structure 101 and the patterned film structure 102 of the present invention, there are a substrate 110 and a patterned polymeric layer 140.

The insulator 111 to go with the conductor 112 forms the substrate 110. The patterned polymeric layer 140 has the pattern 141 transferred from the conductor 112 to selectively cover the substrate 110. Or to say, the patterned polymeric layer 140 at least completely covers the surface 113 of the insulator 111, and may further optionally cover the surface 115 of the conductor 112. The pattern 141 may come in various designs, such as a grid pattern with an extremely small pitch or line width, a geometric pattern, an asymmetric pattern, an irregular pattern, an isolated pattern or repetitive patterns . . . etc.

The patterned polymeric layer 140 consists of at least one of an unsubstituted poly-para-xylylene and a substituted poly-para-xylylene. In one embodiment of the present invention, the patterned polymeric layer 140 exclusively consists of an unsubstituted poly-para-xylylene. In another embodiment of the present invention, the patterned polymeric layer 140 exclusively consists of a substituted poly-para-xylylene. In still another embodiment of the present invention, the patterned polymeric layer 140 consists of an unsubstituted poly-para-xylylene and a substituted poly-para-xylylene.

The substituents of the substituted para-xylylene may be various substituents to imbue the organic film 140 of poly-para-xylylene with desirable physicochemical properties. The substituents may be but not limited to, at least one of an unsaturated bond, halogen, an aldehyde group, an alkyl group substituted with a hydroxyl group, a halo-alkyl group, a 4-trifluoroacetyl group, an amino-alkyl group, an amide group, an amide group comprising a disulfide bond, a carboxyl group, a biotinyl group, an N-hydroxysuccinimdyl group, an N-maleimide and a carboxyl anhydride.

Figure 16:
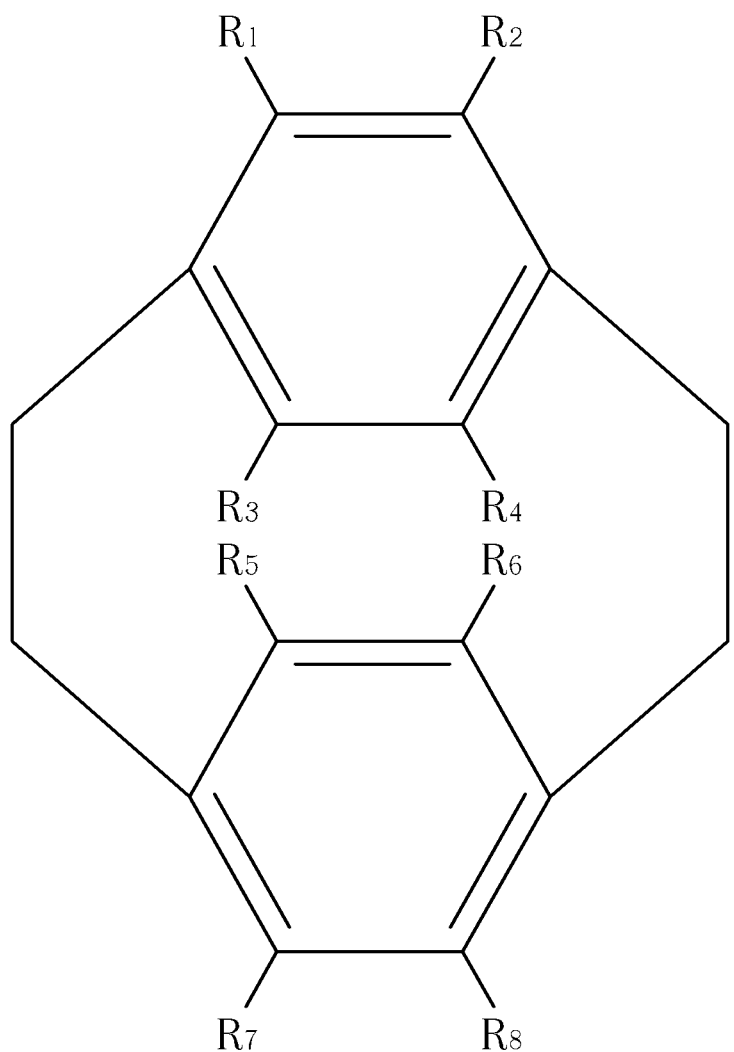
FIG. 16 illustrates the Formula (1) to represent the substituted para-xylylene precursor.

The substituted para-xylylene precursor 130 may be a compound represented by the Formula (1) in FIG. 16. Formula (1) shows the substituted poly-para-xylylenes of the present invention. For example, each substituent $R_1$, $R_2$, $R_3$, $R_4$, $R_5$, $R_6$, $R_7$, $R_8$ may be independently selected from an ethylenic double bond, a triple bound, a functional group comprising an amino (—$NH_2$) group, a functional group comprising a hydroxyl (—OH) group, a functional group comprising an carboxyl (—COOH) group, —C(=O)H, —C(=O)—$CFH_2$, —C(=O)—$CF_3$, —C(=O)—$C_2F_5$, —C(=O)—$C_8F_{17}$, —C(=O)—OH, —C(=O)—Ph, —C≡CH, —CH=$CH_2$, —$CH_2$—OH, —$CH_2$—$NH_2$, —$NH_2$, —C(=O)—O—$CH_3$, —C(=O)—O—$C_2H_5$, —$CH_2$—O—C(=O)—C—$(CH_3)_2$Br, —CH2-O—C(=O)—C≡CH . . . etc. so the organic film 140 may also be a co-polymer consists of different substituted poly-para-xylylene monomers.

Figure 3:
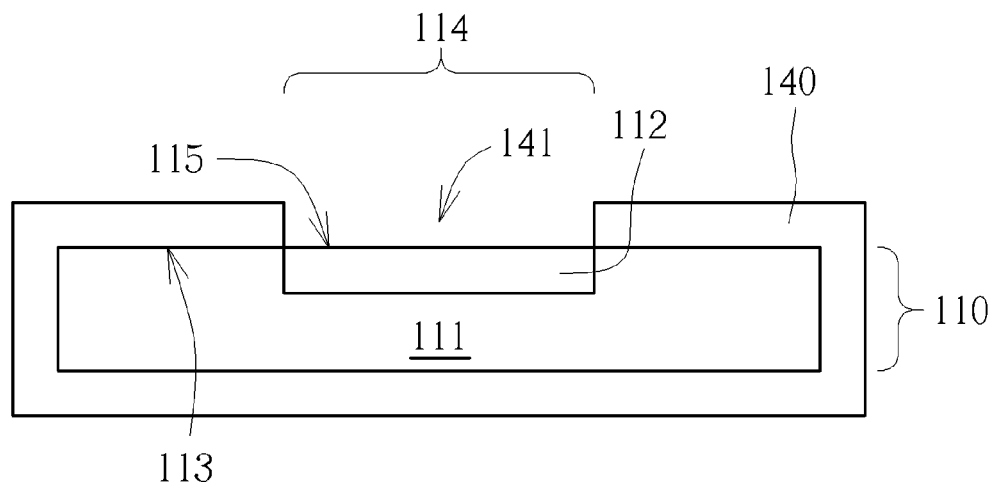

When the substrate 110 is an insulator 111, such as what is illustrated in FIG. 3, the patterned polymeric layer 140 covers part of the surface 113 of the substrate 110, and the pattern 114 selectively exposes the surface 116 of the substrate 110. In one embodiment of the present invention, when the insulator 111 goes with the conductor 112 to form the substrate 110, please refer to FIG. 14, the patterned polymeric layer 140 covers the surface 113 of the substrate 110 but the pattern 141 exposes the surface 115 of the conductor 112. In another embodiment of the present invention, the patterned polymeric layer 140 covers the surface 113 of the insulator 111 as well as the surface 115 of the conductor 112, a s shown in FIG. 15. The thickness of the patterned polymeric layer 140 may be 5 nm to 100 μm.

When the patterned polymeric layer 140 covers the surface 115 of the conductor 112, the thickness of the patterned polymeric layer 140 on the insulator 111 is usually greater than the thickness of the patterned polymeric layer 140 on the conductor 112. This is due to the above-mentioned maximum selective deposition thickness to cause the pattern 141, and it is one of the features of the present invention. No matter the pattern 141 of the polymeric layer 140 completely covers the substrate 110 or not, the pattern 141 of the polymeric layer 140 always self-aligns to the substrate 110, to the surface 113 of the insulator 111, to the pattern 114 of the substrate 110, to the surface 115 of the conductor 112 or to the pattern 116 of the substrate 110. It is another outstanding feature of the present invention.

The following examples of synthesis and experimental embodiments are provided to more comprehensively describe the gist of the present invention but the scope of the present invention is not limited to these following examples or to these following embodiments.

Embodiment 1

First, 4-N-maleimidomethyl-[2,2]paracyclophane 4 is synthesized. Reaction (1) shows the synthesis of 4-N-maleimidomethyl-[2,2] paracyclophane. Referring to Reaction (1) in FIG. 17, in a nitrogen environment, titanium (IV) chloride ($TiCl_4$) (8.4 mL, 77 mmol) is added slowly to a market-purchased solution of [2,2]paracyclophane 1 (8.0 g, 38 mmol) in anhydrous $CH_2Cl_2$ (400 mL). The mixture is stirred for 20 minutes, followed by the dropwise addition of α,α-dichloromethyl methyl ether ($CHCl_2OCH_3$) (4.0 mL, 44 mmol) at room temperature.

The mixture is then continuously stirred for 6 hours to perform a Rieche formylation. Then, the mixture is poured into water (200 mL) and stirred for another 2 hours. The solution is washed with 3M HCl (2×300 mL) and then with water (2×300 mL), and dried over $MgSO_4$.

After filtration and removal of the solvent, the crude product is purified using hexane/dichloromethane (5/1) as eluent to yield 4-formyl-[2,2]paracyclophane 2 as crystals (6.6 g, 83%). The crystals are dissolved in a mixture of MeOH (200 mL) and anhydrous Tetrahydrofuran (THF) (10 mL). Then, sodiumborohydride ($NaBH_4$) (2.1 g, 28 mmol) is added carefully and the mixture is stirred at room temperature for 3 hours. The excess $NaBH_4$ is then decomposed by addition of water.

The resulting solution is then diluted by ethyl acetate (200 mL), washed with 3M HCl (3×200 mL) and water (2×200 mL), and dried over $MgSO_4$. After filtration and removal of the solvent, 4-(hydroxymethyl)-[2,2]paracyclophane 3 is obtained as crystals (6.0 g, 75%).

Next, the resulting 4-(hydroxymethyl)-[2,2]paracyclophane 3 (6.0 g) and triphenylphosphine ($PPh_3$) (13.1 g) are dissolved in anhydrous THF, to which diisopropyl azodicarboxylate (DIAD) (10 mL) is added carefully and the mixture is stirred at room temperature for 20 minutes. Then, a previously prepared maleimide solution (4.9 g maleimide in 30 mL anhydrous THF) is added to the resulting mixture and stirred at room temperature for 24 hours. The solution is then diluted with dichloromethane (200 mL), washed with 3M HCl (3×200 mL) and water (2×200 mL), and dried over $MgSO_4$. The crude product is purified using hexane/ethyl acetate (5/1) to yield 4-N-maleimidomethyl-[2,2]paracyclophane 4 as crystals (5.2 g, 65%).

Then, poly[(4-N-maleimidomethyl-p-xylylene)-co-(p-xylylene)] 5 is prepared from 4-N-maleimidomethyl-[2,2]paracyclophane 4 with a CVD polymerization process, wherein m:n=1:1. Throughout the process, a constant argon flow rate of 10 s.c.c.m. and a system pressure of 75 mTorr are maintained. The sublimation temperature is set between 110° C. and 120° C., and the pyrolysis temperature is set at 580° C. Under these conditions, CVD polymerization occurs spontaneously on substrates that are placed on a rotating, cooled (15° C.) sample holder.

A deposition rate of about 0.3 Å/s is monitored on the basis of in situ quartz crystal microbalancing analysis. Moreover, using an ellipsometer, the thickness of the resulting maleimide-functionalized poly-p-xylylene coating deposited is measured in the range of 60 nm to 80 nm. Generally speaking, the unsubstituted poly-para-xylylene monomer and different substituted poly-para-xylylene monomers are polymerized in a random way.

Embodiment 2

First, the device as shown in FIG. 2A is used to feed the starting material 4-ethynyl-[2,2]paracyclophane, the starting material 4-N-maleimidomethyl-[2,2]paracyclophane and the starting material trifluoroacetyl-[2.2]paracyclophane from different directions into the reaction chamber 120. The starting material 4-ethynyl-[2,2]paracyclophane, 4-N-maleimidomethyl-[2,2]paracyclophane and trifluoroacetyl-[2.2]paracyclophane are provided in a 1:1:1 ratio.

In addition, as shown in FIG. 2A, before entering the reaction chamber 120, the three starting material each passes through several pre-treating units. The pre-treating units maybe a sublimation zone (about 105° C.) or a pyrolysis zone 122 (about 70° C.). Furthermore, there is a silicon material substrate 110 in the reaction chamber 120 to control the temperature about 20° C. at 2 rpm/min.

Figure 17:
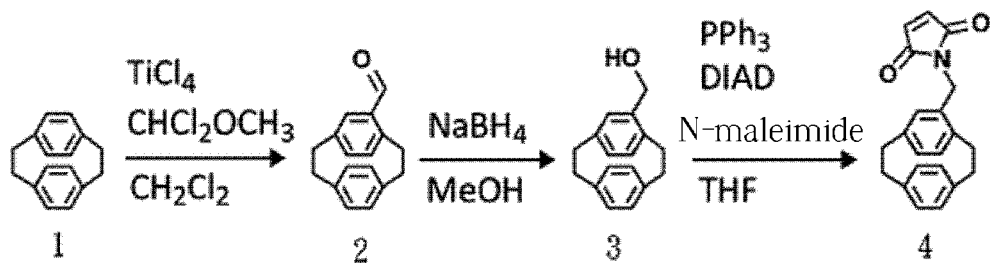
FIG. 17 illustrates the chemical synthesis of the Reaction (1), the Reaction (2) and the Reaction (3).
Figure 17:
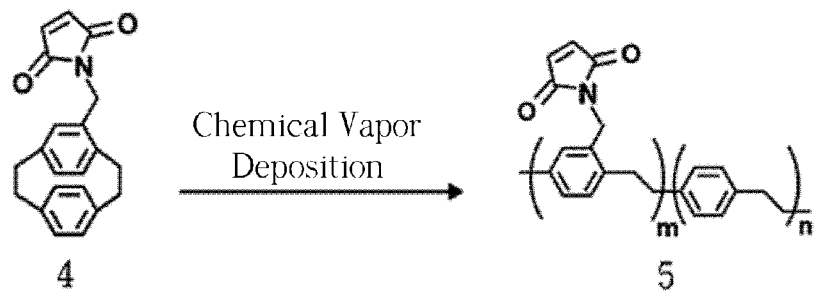
Figure 17:
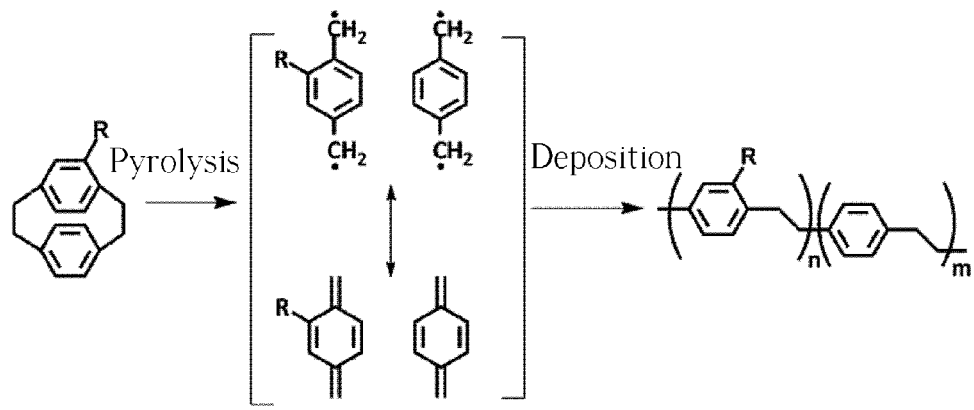

After the starting materials are fed into the reaction chamber 120, the co-polymer poly[(4-ethynyl-p-xylylene)-co-(4-N-maleimidomethyl-p-xylylene)-co-(trifluoroacetyl-p-xylylene)-co-(p-xylylene)] organic film 140 is obtained on the silicon material substrate 110 from the polymerization of the starting materials by chemical vapor deposition in accordance with Reaction 2 in FIG. 17. Generally speaking, each para-xylylene monomer is polymerized in a random way.

Embodiment 3

Infrared reflection-absorption spectroscopy (IRRAS) is used to analyze the co-polymer organic film 140 with the above three functional groups, and the spectrum of the co-polymer (IV) organic film 140 is individually compared with the reference spectrum of poly[(4-ethynyl-p-xylylene)-co-(p-xylylene)] (I), poly[(4-N-maleimidomethyl-p-xylylene)-co-(p-xylylene)] (II), and poly[(trifluoroacetyl-p-xylylene)-co-(p-xylylene)] (III) (in short, each reference spectrum has only one target functional group).

Figure 18:
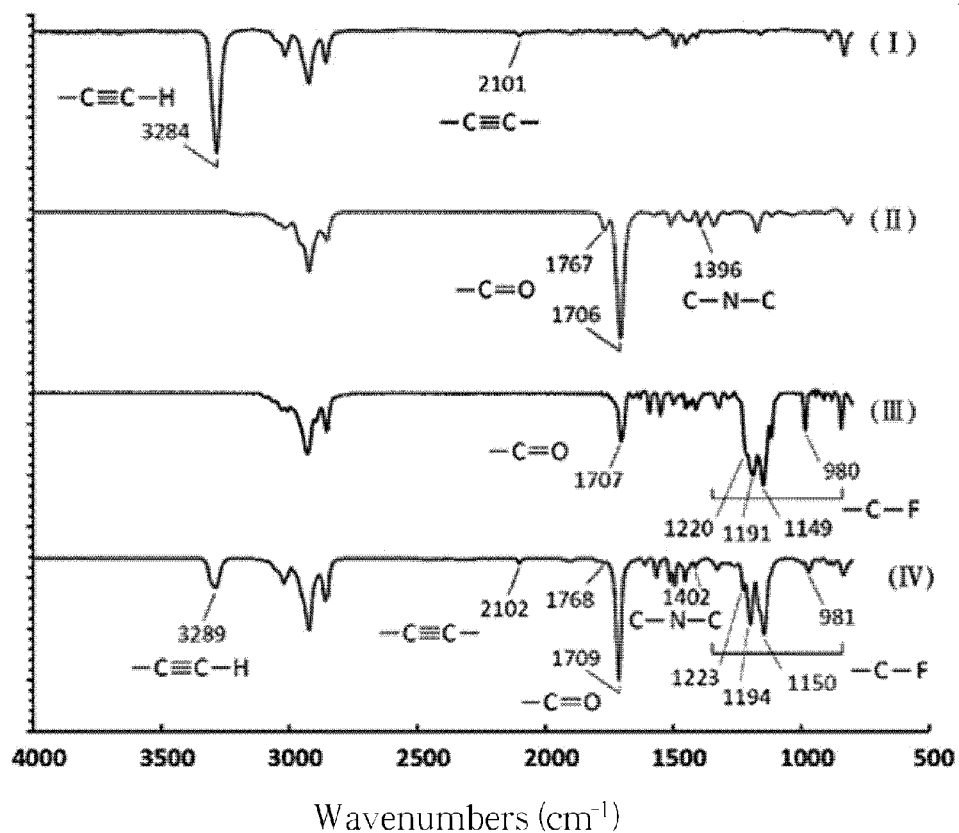
FIG. 18 shows the spectrum of the co-polymer and individual comparison with the reference spectra of three different functional groups.

The spectrum in FIG. 18 shows that the spectrum of the co-polymer (IV) organic film 140 has two strong peaks in the region 3289 $cm^{-1}$ and 2102 $cm^{-1}$ corresponding to the terminal acetylene, another two strong peaks in the region 1768 $cm^{-1}$ and 1709 $cm^{-1}$ corresponding to the carbonyl bond (C=O) of the maleimidomethyl group and trifluoroacetyl group, another strong peak in the region 1402 $cm^{-1}$ corresponding to the C—N—C bond of the maleimidomethyl group and other strong peaks in the region 1223 $cm^{-1}$, 1194 $cm^{-1}$, 1150 $cm^{-1}$, and 981 $cm^{-1}$ corresponding to the C—F bond of the trifluoroacetyl group.

Embodiment 4

X-ray photoelectron spectroscopy is used to analyze the co-polymer organic film 140 to obtain the results listed in Table 1 in FIG. 19. Table 1 shows the X-ray photoelectron spectroscopy of the co-polymer organic film. Please refer to Table 1, the experimental values are consistent with the calculated theoretical values which are derived from the monomer units of equal molar ratios.

Embodiment 5

A paracylophane film containing functional group with disulfide bond, such as a paracylophane with thiol-disulfide carboxylic acid end group is provided. In the following paragraphs, each step of the method will be further detailed using (4-(3-((3-methylamido)-disulfide)propanoic acid)[2,2] paracyclophane as an example. It is noted that the chemical manufacturing company described below is only one example in the present invention and is not to the limitation to the scope the claimed invention.

Five steps are needed for the synthesis of 4-(3-((3-Methylamido)disulfide)propanoic acid) [2,2]paracyclophane from commercially available [2,2]paracyclophane (Sigma-Aldrich, St. Louis, Mo., USA). Titanium(IV) chloride (8.4 mL, 77 mmol) (Sigma-Aldrich) was added slowly to an ice-cooled solution of [2,2]paracyclophane (8.0 g, 38 mmol) in anhydrous $CH_2Cl_2$ (400 mL) under a nitrogen environment. The mixture was stirred for 20 min, followed by the dropwise addition of α,α-dichloromethyl methyl ether (4.0 mL, 44 mmol; Sigma-Aldrich). The reaction mixture was stirred at room temperature for 6 h, subsequently poured into water, and then stirred for an additional 2 h (200 mL). Next, the organic layer was washed with 3 M HCl (2×300 mL) and then with water (2×300 mL), after which it was dried over $MgSO_4$. After filtration and removal of the solvent, the crude product was purified on silica gel using hexane/$CH_2Cl_2$ (5/1) as the eluent to yield 4-formyl [2,2]paracyclophane as white crystals (6.6 g, 83%).

The crystals were then dissolved in a mixture of MeOH (200 mL) and anhydrous tetrahydrofuran (THF; 10 mL). $NaBH_4$ (2.1 g, 28 mmol; Sigma-Aldrich) was added carefully to this solution, and the mixture was stirred at room temperature for 3 h. The excess $NaBH_4$ was then decomposed by the careful addition of water. The solution was then diluted with EtOAc (200 mL), washed with 3 M HCl (3×200 mL) and then with water (2×200 mL), and dried over $MgSO_4$. After filtration and removal of the solvent, 4-hydroxymethyl[2,2]paracyclophane was obtained as white crystals (6.0 g, 75%), which were used without further purification. The 4-hydroxymethyl[2,2]paracyclophane was dissolved in anhydrous $CH_2Cl_2$ (200 mL) and cooled to 0° C. under a nitrogen environment.

Next, $PBr_3$ (3.00 mL, 31.8 mmol; Sigma-Aldrich) was added dropwisely, and the mixture was stirred for 4 h. The reaction was hydrolyzed by the addition of water (150 mL), and the phases were separated. The organic layer was washed with 1 M HCl (150 mL), saturated $NaHCO_3$ solution (150 mL), and saturated NaCl solution (150 mL). It was then dried over $MgSO_4$ and filtered, after which the solvent was removed in vacuum. The crude product 4-bromomethyl[2,2] paracyclophane (5.81 g, 77%) was used in the next step without further purification.

Crude 4-bromomethyl[2,2]paracyclophane and potassium phthalimide (3.71 g, 20.0 mmol; Sigma-Aldrich) were dissolved in dimethylformamide (100 mL) and heated to 80° C. for 4 h. After complete conversion (TLC control), the solvent was removed in vacuum and the residue was dissolved in EtOAc (500 mL) and washed with saturated NaCl solution (400 mL). The aqueous phase was extracted with CH$_2$Cl$_2$ (2×200 mL), and the combined organic phases were dried over MgSO$_4$. After removal of the solvent, the crude product (7.06 g) was dissolved in MeOH (300 mL) and hydrazine (19 mL, 80% in water; Sigma Aldrich) was added. The reaction mixture was heated to 60° C. for 1 h (TLC control). Next, the solvent was removed, and the residue was taken up in CH$_2$Cl$_2$ (500 mL) and 1 M NaOH solution (300 mL). The phases were separated, and the aqueous phase was extracted with CH$_2$Cl$_2$ (300 mL). The combined organic phases were washed with 1 M NaOH (300 mL) and brine (300 mL). The organic phase was dried over MgSO$_4$, and the solvent was removed in vacuum. The crude product was purified on silica gel using CH$_2$Cl$_2$/MeOH (9/1) to yield 4-aminomethyl[2,2]paracyclophane (2.57 g, 56%).

Next, 3,3'-dithiodipropionic acid (2.10 g, 10 mmol; Sigma-Aldrich) and N-ethyl-N'-(3-(dimethylamino)propyl) carbodiimide (EDC; 1.55 g, 10 mmol; Alfa Aesar, Ward Hill, Mass., USA) were dissolved in anhydrous THF (250 mL) and stirred at room temperature for 20 min. 4-aminomethyl [2,2]paracyclophane (2.37 g) was added to the resulting solution and reacted at room temperature for 12 h. The reaction product was washed with saturated NaHCO$_3$ solution (3×500 mL) and dried over MgSO$_4$. The crude product was purified on silica gel using hexane/ethyl acetate (5/1) to yield 4-(3-((3-methylamido)-disulfide)propanoic acid) [2,2] paracyclophane as white crystals (2.71 g, 63%).

Figure 20:
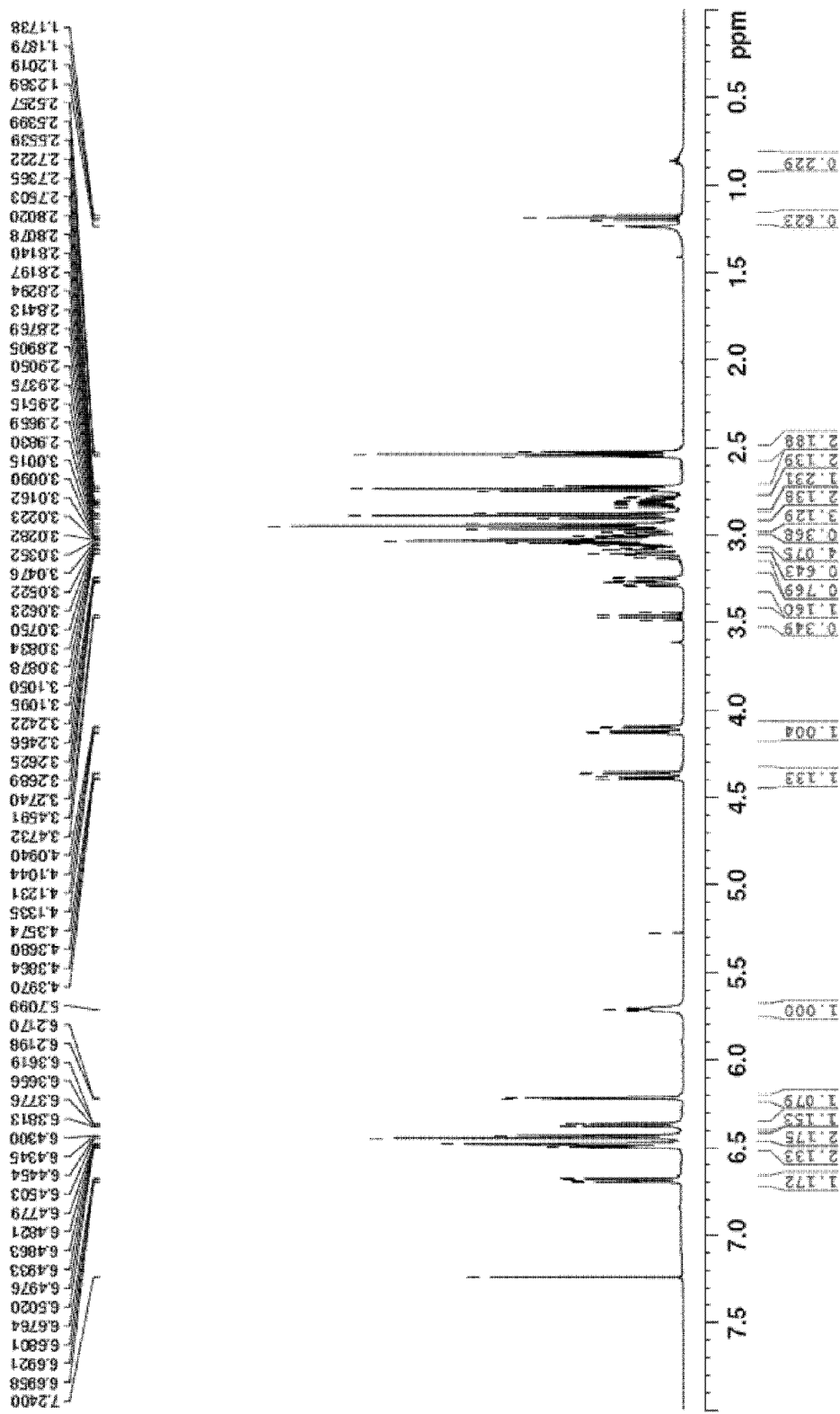
FIG. 20 is a $^1$H NMR spectrum of 4-(3-((3-methylamido)-disulfide) propanoic acid)[2,2]paracyclophane.
Figure 21:
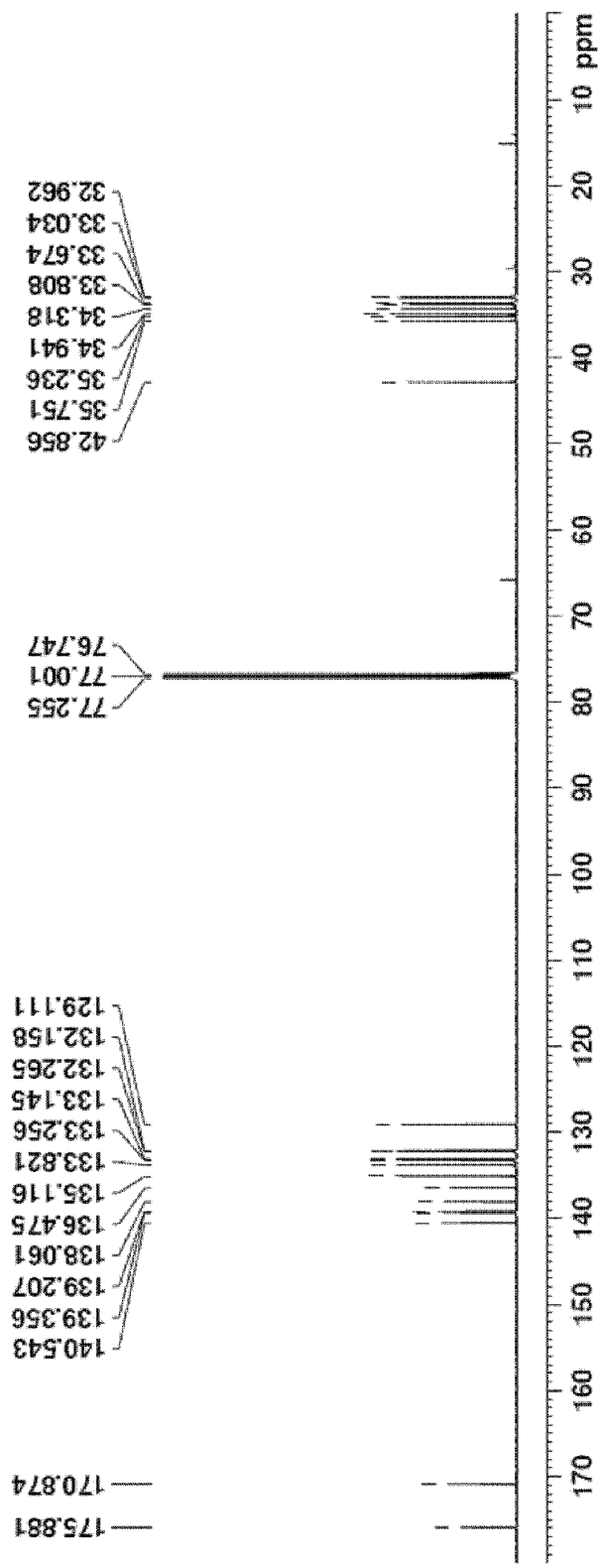
FIG. 21 is a $^{13}$C NMR spectrum of 4-(3-((3-methylamido)-disulfide) propanoic acid)[2,2]paracyclophane.
Figure 22:
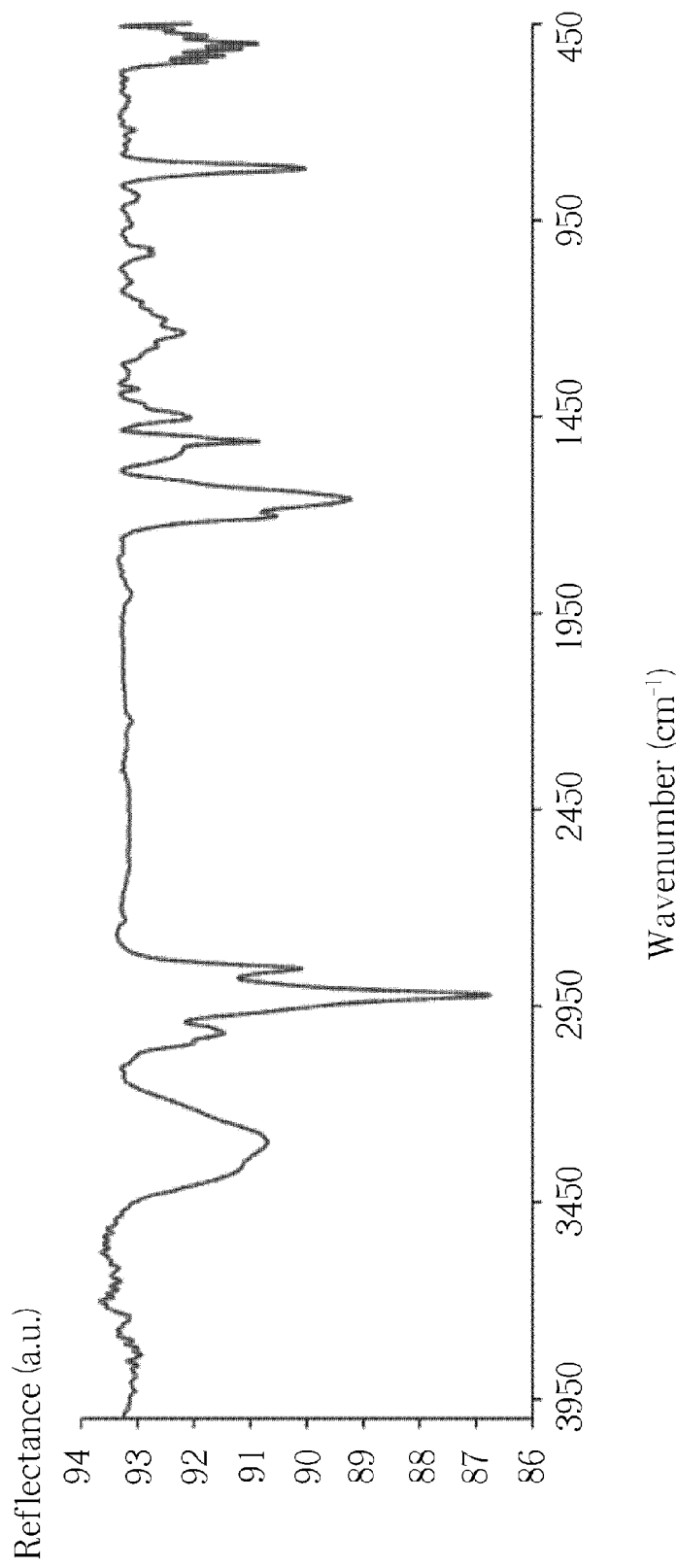
FIG. 22 is a FT-IR spectrum of 4-(3-((3-methylamido)-disulfide) propanoic acid)[2,2]paracyclophane.
Figure 23:
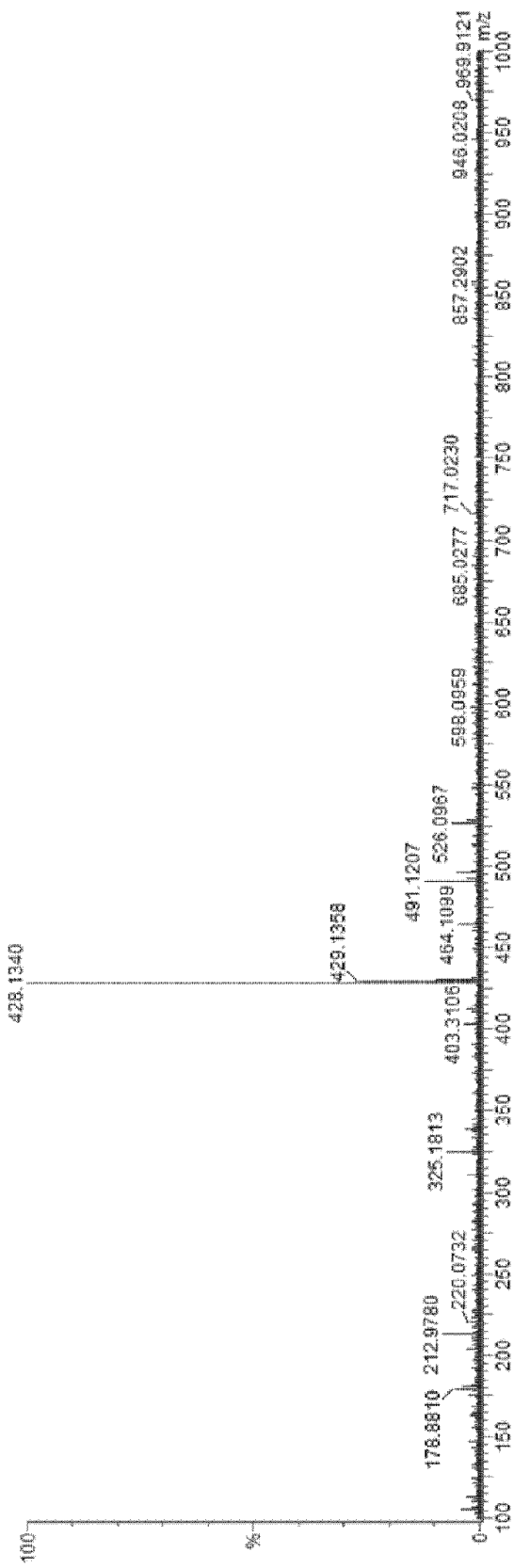
FIG. 23 is an ESI-MS spectrum of 4-(3-((3-methylamido)-disulfide) propanoic acid)[2,2]paracyclophane.

The following parameters were obtained from NMR, FT-IR, and ESI-MS analyses of the product. Please refer to FIG. 20, FIG. 21, FIG. 22 and FIG. 23. FIG. 20 is a $^1$H NMR spectrum, FIG. 21 is a $^{13}$C NMR spectrum, FIG. 22 is a FT-IR spectrum, and FIG. 23 is an ESI-MS spectrum of 4-(3-((3-methylamido)-disulfide)propanoic acid) [2,2]paracyclophane. As shown in FIG. 20, the parameters of $^1$H NMR: (500 MHz, CDCl$_3$, TMS): δ 6.67-6.69 (2d, J=1.9 Hz, 1.9 Hz, 1H), 6.36-6.50 (m, 5H), 6.21 (d, J=1.40 Hz, 1H), 5.71 (s, 1H), 4.35-4.40 (2d, J=5.3 Hz, 5.3 Hz, 1H), 4.09-4.13 (2d, J=5.2 Hz, 5.2 Hz, 1H), 2.72-3.47 (m, 16H), 2.52-2.55 (t, J=14.1 Hz, 2H). As shown in FIG. 21, the parameters of $^{13}$C NMR (125 MHz, CDCl$_3$, TMS): δ 32.9, 33.0, 33.6, 33.8, 34.3, 34.9, 35.2, 35.7, 42.8, 129.1, 132.1, 132.2, 133.1, 133.2, 133.8, 135.1, 136.4, 138.0, 139.2, 139.3, 140.5, 170.8, 175.8. As shown in FIG. 22, the parameters of FT-IR: 3291 (m), 3024 (w), 2924 (m), 2853 (w), 1704 (s), 1668 (s), 1621 (m), 1520 (w), 1513 (m), 1444 (m), 1419 (m), 1332 (w), 1231 (w), 1204 (w), 1181 (w), 1041 (m), 940 (vw), 890 (vw), 823 (m), 762 (vw), 725 (vw), 624 (vw), 548 (w), 519 (m), 492 (w). As shown in FIG. 23, the parameters of ESI-MS: m/z (%) 428.15 (100) [M+]. With such spectrum data, it is demonstrated that the method of according to the present invention can obtain 4-(3-((3-methylamido)-disulfide)propanoic acid) [2,2]paracyclophane as products.

Afterwards, the obtained paracyclophane containing a disulfide functional group can be further polymerized in accordance with Reaction (3) in FIG. 17, and then coated on a substrate through a chemical vapor deposition (CVD) process to form a chemical film comprising N-hydroxysuccinimide ester-functionalized poly-p-xylene. Reaction (3) shows the obtained paracyclophane containing a disulfide functional group can be further polymerized. In one preferred embodiment, R is a functional group containing disulfide bond, such as a derivative containing an amide-thiol-disulfide carboxylic acid functional group, and in one preferred embodiment, R is 4-(3-((3-methylamido)-disulfide) propanoic acid. Generally speaking, the unsubstituted poly-para-xylylene monomer and different substituted poly-para-xylylene monomers are polymerized in a random way.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A patterned film structure, consisting of a substrate and a patterned polymeric layer which selectively covers a surface of said substrate, wherein said patterned polymeric layer consists of an unsubstituted poly-para-xylylene or of a substituted poly-para-xylylene to selectively expose said surface of said substrate and said patterned polymeric layer is a co-polymer selected from monomers consisting of an unsubstituted poly-para-xylylene monomer and a substituted poly-para-xylylene monomer.

2. The patterned film structure of claim 1, wherein said substrate is selected from a group consisting of an insulator and of a conductor.

3. The patterned film structure of claim 1, wherein said substituted poly-para-xylylene is a poly-para-xylylene substituted with an unsaturated bond, halogen, an aldehyde group, an alkyl group substituted with a hydroxyl group, a halo-alkyl group, a 4-trifluoroacetyl group, an amino-alkyl group, an amide group, an amide group comprising a disulfide bond, a carboxyl group, a biotinyl group, an N-hydroxysuccinimdyl group, an N-maleimide or a carboxyl anhydride.

4. The patterned film structure of claim 1, wherein said patterned polymeric layer has a thickness from 5 nm to 100 μm.

5. A patterned film composite structure, comprising:
a substrate;
a conductor layer selectively covering the surface of said substrate; and
a patterned polymeric layer together with said conductor layer to completely cover the surface of said substrate, wherein said patterned polymeric layer consists of an unsubstituted poly-para-xylylene or a substituted poly-para-xylylene.

6. The patterned film composite structure of claim 5, wherein said substrate is a patterned substrate.

7. The patterned film structure of claim 5, wherein said patterned polymeric layer is a co-polymer selected from monomers consisting of an unsubstituted poly-para-xylylene monomer and a substituted poly-para-xylylene monomer.

8. The patterned film structure of claim 5, wherein said substituted poly-para-xylylene is a poly-para-xylylene substituted with an unsaturated bond, a halogen, an aldehyde group, an alkyl group substituted with a hydroxyl group, a halo-alkyl group, a 4-trifluoroacetyl group, an amino-alkyl group, an amide group, an amide group comprising a disulfide bond, a carboxyl group, a biotinyl group, an N-hydroxysuccinimdyl group, an N-maleimide or a carboxyl anhydride.

9. The patterned film structure of claim 5, wherein said patterned polymeric layer covers said conductor layer.

10. The patterned film structure of claim 9, wherein said patterned polymeric layer has a variable thickness from 5 nm to 100 μm.

11. The patterned film structure of claim 5, wherein said patterned polymeric layer does not cover said conductor layer.

12. The patterned film structure of claim 11, wherein said patterned polymeric layer has a variable thickness from 5 nm to 100 μm.

13. A method to selectively inhibit the formation of an organic film, comprising:
providing a substrate; and
providing a precursor under a pre-determined condition so that said precursor forms an organic film on said substrate and said organic film consists of an unsubstituted poly-para-xylylene or a substituted poly-para-xylylene, wherein said pre-determined condition selectively inhibits the formation of said organic film so that said organic film forms a given pattern which selectively covers said substrate and selectively exposes the surface of said substrate.

14. The method to selectively inhibit the formation of an organic film of claim 13, wherein said substrate is selected from a group consisting of a conductor, an insulator and combinations thereof, and said organic film does not cover said conductor.

15. The method to selectively inhibit the formation of an organic film of claim 13, wherein said pre-determined condition is selected from a group consisting of adjusting voltage, adjusting a charge density, adjusting a deposition rate, adjusting the ingredient of said precursor, adjusting the formation time of selectively inhibiting, adjusting the formation temperature of selectively inhibiting and adjusting the composition of said substrate.

16. The method to selectively inhibit the formation of an organic film of claim 13, wherein said organic film is a co-polymer selected from monomers consisting of an unsubstituted poly-para-xylylene monomer and a substituted poly-para-xylylene monomer.

17. The method to selectively inhibit the formation of an organic film of claim 16, wherein said substituted poly-para-xylylene is a poly-para-xylylene substituted with an unsaturated bond, a halogen, an aldehyde group, an alkyl group substituted with a hydroxyl group, a halo-alkyl group, a 4-trifluoroacetyl group, an amino-alkyl group, an amide group, an amide group comprising a disulfide bond, a carboxyl group, a biotinyl group, an N-hydroxysuccinimdyl group, an N-maleimide or a carboxyl anhydride.

18. The method to selectively inhibit the formation of an organic film of claim 16, wherein said organic film has a thickness from 5 nm to 100 µm.

19. A method to selectively adjust the thickness of an organic film, comprising:
providing a substrate comprising a patterned conductor layer which is exposed; and
providing a precursor under a pre-determined condition so that said precursor forms an organic film completely covering said substrate and said organic film is selected from a group consisting of an unsubstituted poly-para-xylylene and a substituted poly-para-xylylene, wherein said organic film forms a given pattern of a thickness which is variable on said substrate.

20. The method to selectively adjust the thickness of an organic film of claim 19, wherein said substrate is selected from a group consisting of said patterned conductor layer and of an insulator, and said thickness on said insulator is greater than that on said patterned conductor layer.

21. The method to selectively adjust the thickness of an organic film of claim 19, wherein said pre-determined condition is selected from a group consisting of adjusting voltage, adjusting a charge density, adjusting a deposition rate, adjusting the ingredient of said precursor, adjusting the formation time of selectively inhibiting, adjusting the formation temperature of selectively inhibiting and adjusting the composition of said substrate.

22. The method to selectively adjust the thickness of an organic film of claim 19, wherein said substituted poly-para-xylylene is a poly-para-xylylene substituted with an unsaturated bond, a halogen, an aldehyde group, an alkyl group substituted with a hydroxyl group, a halo-alkyl group, a 4-trifluoroacetyl group, an amino-alkyl group, an amide group, an amide group comprising a disulfide bond, a carboxyl group, a biotinyl group, an N-hydroxysuccinimdyl group, an N-maleimide or a carboxyl anhydride.

\* \* \* \* \*